United States Patent
Shirakawa et al.

(10) Patent No.: US 8,649,224 B2
(45) Date of Patent: Feb. 11, 2014

(54) NON-VOLATILE SEMICONDUCTOR MEMORY DEVICE

(75) Inventors: Masanobu Shirakawa, Chigasaki (JP); Hiroshi Sukegawa, Nerima-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 231 days.

(21) Appl. No.: 13/329,553

(22) Filed: Dec. 19, 2011

(65) Prior Publication Data

US 2012/0250420 A1    Oct. 4, 2012

(30) Foreign Application Priority Data

Apr. 1, 2011  (JP) .................................. 2011-081836

(51) Int. Cl.
*G11C 11/34*    (2006.01)
(52) U.S. Cl.
USPC ............ 365/185.22; 365/185.18; 365/189.05; 365/189.16
(58) Field of Classification Search
USPC .............. 365/185.22, 185.18, 189.05, 189.15
See application file for complete search history.

(56) References Cited

U.S. PATENT DOCUMENTS

| | | | |
|---|---|---|---|
| 7,259,991 B2 * | 8/2007 | Aritome ................... | 365/185.17 |
| 7,508,711 B2 * | 3/2009 | Goda ....................... | 365/185.17 |
| 7,830,716 B2 * | 11/2010 | Morton et al. ........... | 365/185.17 |
| 2008/0180994 A1 | 7/2008 | Katsumata et al. | |
| 2009/0147581 A1 | 6/2009 | Isobe | |

FOREIGN PATENT DOCUMENTS

JP    2009-140564    6/2009

* cited by examiner

*Primary Examiner* — Son Dinh
(74) *Attorney, Agent, or Firm* — Oblon, Spivak, McClelland, Maier & Neustadt, L.L.P.

(57) ABSTRACT

A control circuit performs a read operation of reading data held in a memory-cell by supplying a selected word-line with a read voltage that is a voltage between the lower limit and the upper limit of a plurality of threshold-voltage distributions provided to the memory-cell. The control circuit also performs a verify operation of determining whether a write operation is completed by supplying a selected word-line with a verify voltage higher than the read voltage to read the memory cell. The control circuit then performs a data variation determination operation of determining whether the memory-cells connected to a selected word-line each have a threshold voltage equal to or less than a certain value to determine, from among the plurality of memory cells connected to the selected word-line, whether the number of memory cells where data variation has occurred is not less than a certain number.

20 Claims, 26 Drawing Sheets

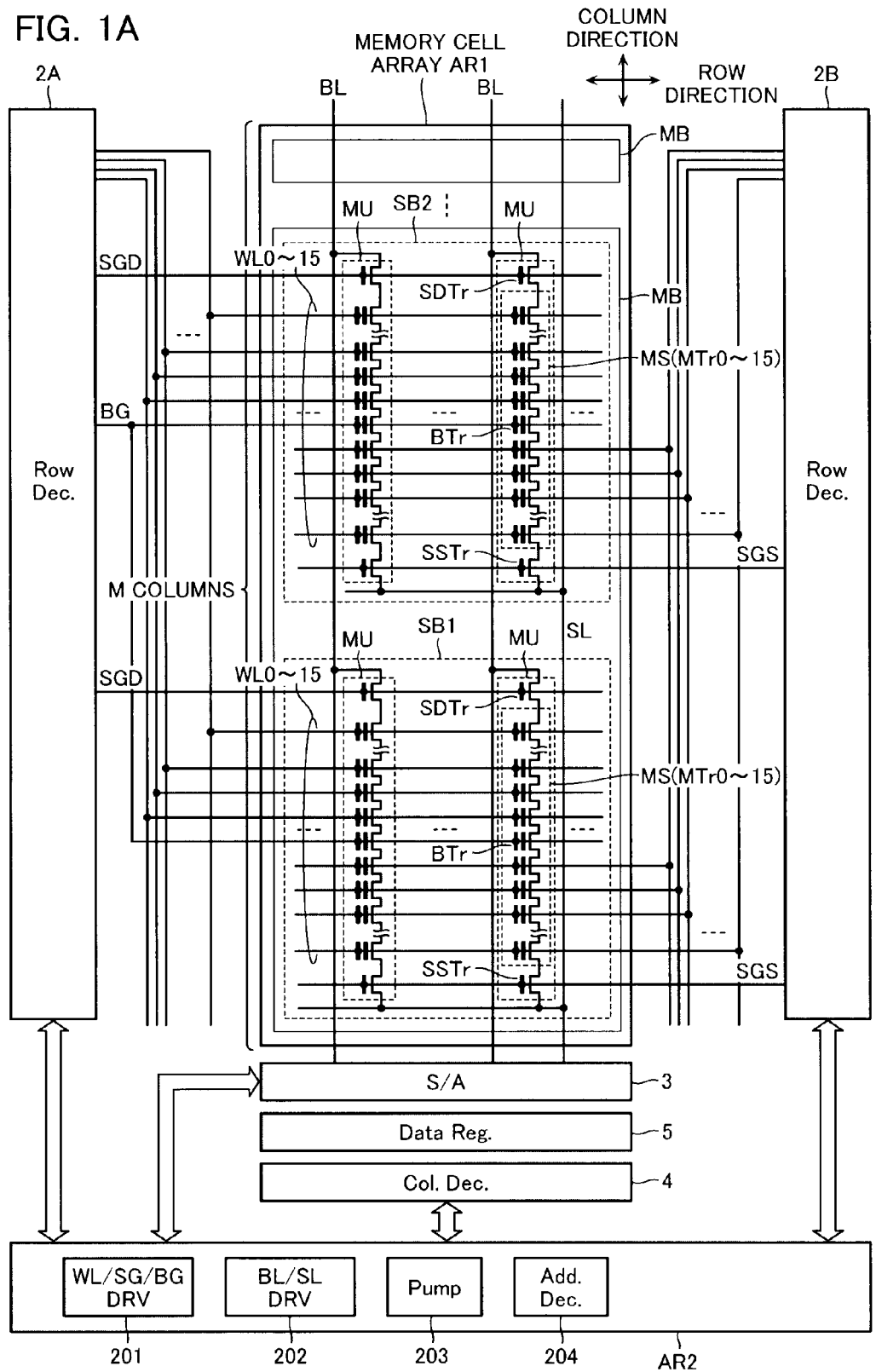

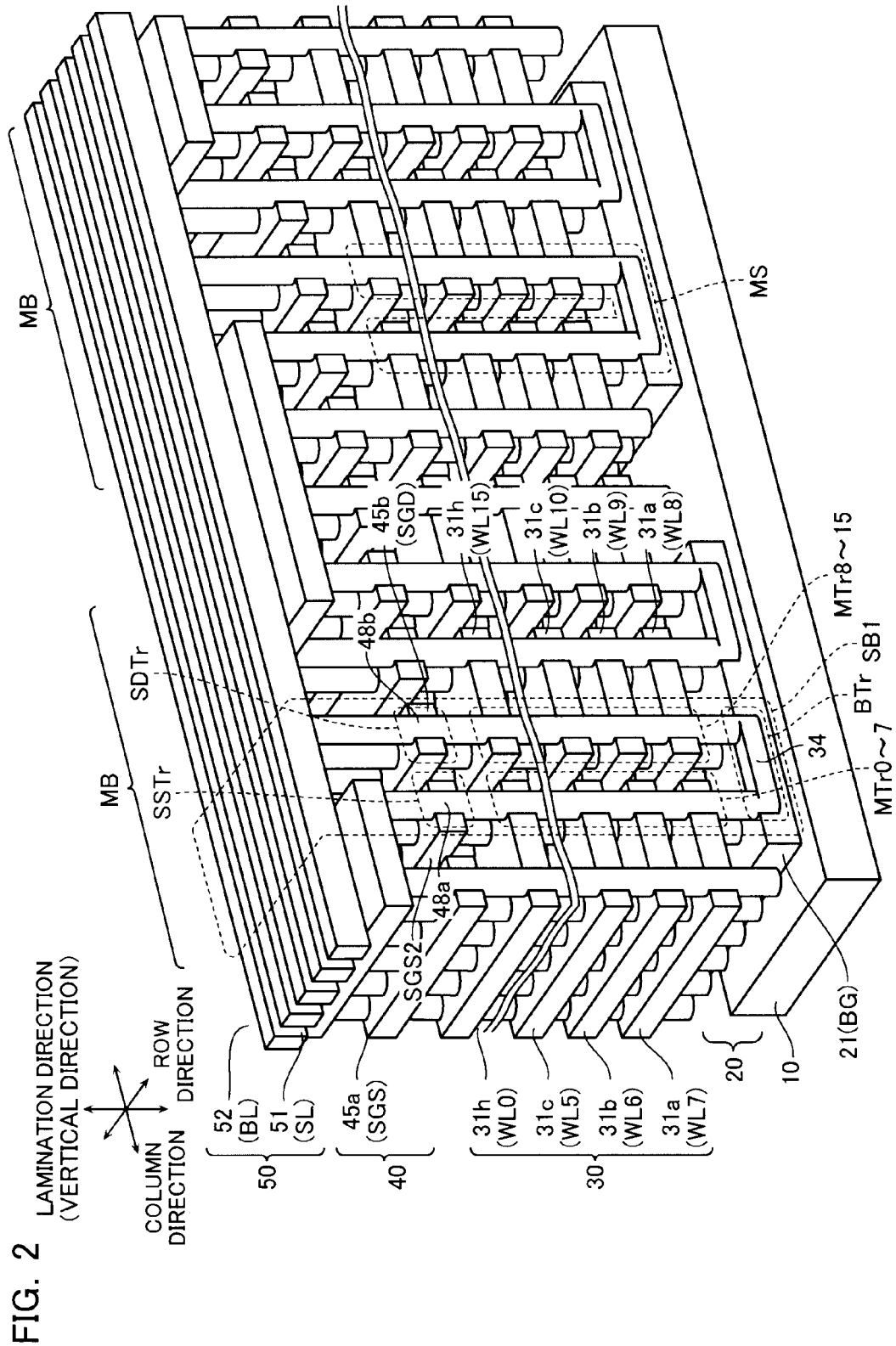

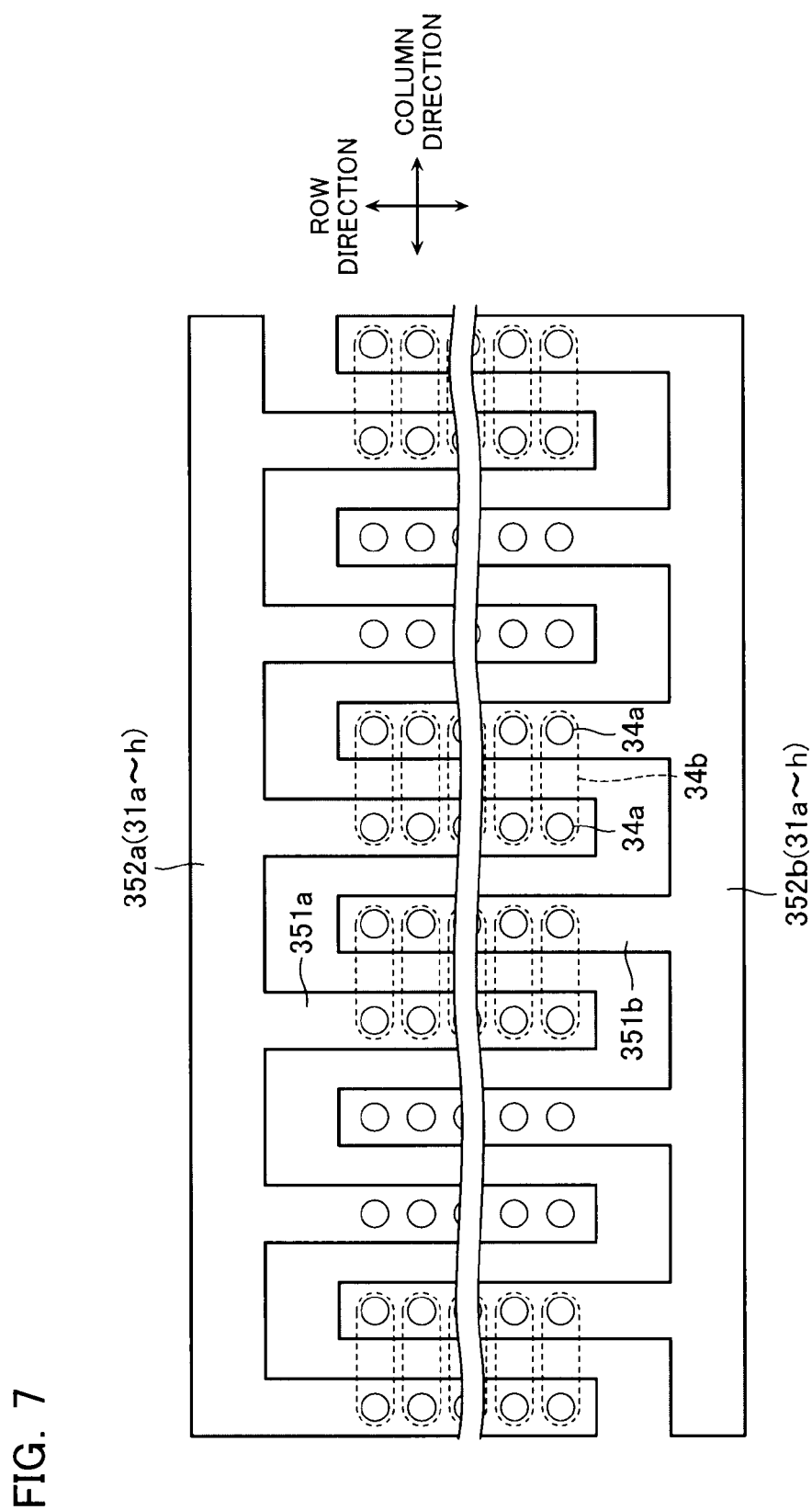

(1) EO read    ~SA→LAT1
(2) AR" read   ~SA→LAT2
(3) AO read    ~SA→LAT1
(4) BR" read   ~SA→LAT2
(5) BO read    ~SA→LAT1
(6) CR" read   ~SA→LAT2

~(LAT1)&(LAT2)→LAT3
~(LAT1)&(LAT2) | LAT3→LAT3
~(LAT1)&(LAT2) | LAT3→LAT3

NON-VOLATILE SEMICONDUCTOR MEMORY DEVICE

CROSS REFERENCE TO RELATED APPLICATIONS

This application is based on and claims the benefit of priority from prior Japanese Patent Application No. 2011-81836, filed on Apr. 1, 2011, the entire contents of which are incorporated herein by reference.

FIELD

The embodiments described in the present specification relate to a non-volatile semiconductor memory device.

BACKGROUND

In recent years, for a more integrated memory, a number of semiconductor memory devices (stacked non-volatile semiconductor memory devices) including three-dimensionally arranged memory cells have been proposed.

BRIEF DESCRIPTION OF THE DRAWINGS

FIG. 1A is a schematic view of the entire configuration of a non-volatile semiconductor memory device according to a first embodiment.

FIG. 2 is a schematic perspective view of the memory cell array AR1 in FIG. 1.

FIG. 7 is a plan view of the memory block MB in FIG. 6.

DETAILED DESCRIPTION

Figure 1B:
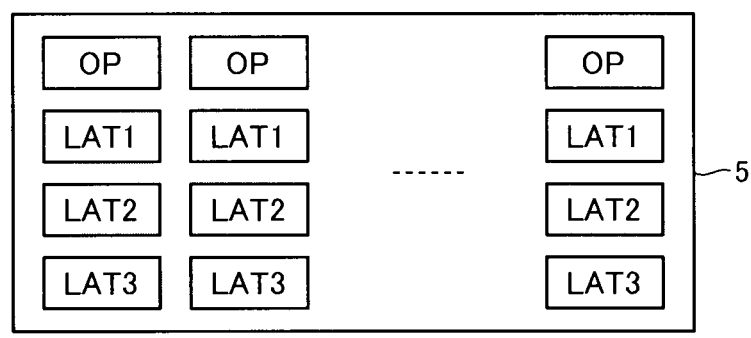
FIG. 1B is a block diagram of the configuration of the data register 5 in FIG. 1.

A non-volatile semiconductor memory device according to the embodiments described below includes a semiconductor substrate; a memory string extending in the vertical direction with respect to the semiconductor substrate and including a plurality of memory cells connected in series; a drain-side select transistor connected to a first end of the memory string; a source-side select transistor connected to a second end of the memory string; a plurality of word lines connected to the memory cell; a plurality of bit lines connected to the drain-side select transistor; a source line connected to the source-side select transistor; and a control circuit configured to control a voltage applied to the drain-side select transistor, the source-side select transistor, the word lines, and the bit lines. The control circuit performs a data variation determination operation of determining whether the memory cells connected to a selected word line each have a threshold voltage equal to or less than a certain value to determine whether the number of data variations which occurred in the memory cells is not less than a certain number.

Referring now to the drawings, a non-volatile semiconductor memory device of the embodiments according to the present invention will be described below.

It will be understood that when an element is referred to as being "connected to" another element, it can be not only directly connected but also connected to the other element or intervening elements may be present.

First Embodiment

First, with reference to FIG. 1A, the entire configuration of a non-volatile semiconductor memory device according to a first embodiment will be described.

With reference to FIG. 1A, a non-volatile semiconductor memory device according to the first embodiment includes a memory cell array AR1, and row decoders 2A and 2B provided in the periphery of the memory cell array AR1, a sense amplifier circuit 3, a column decoder 4, a data register 5, and a control circuit AR2.

The memory cell array AR1 includes, as shown in FIG. 1A, memory strings MS arranged in a matrix, each memory string MS including electrically rewritable memory cells MTr0 to MTr15 (memory cell) and back gate transistors BTr connected in series.

The row decoders 2A and 2B are disposed on the left side and the right side of the memory cell array AR1, respectively. The row decoders 2A and 2B drive, according to an address signal from the control circuit AR2, a word line WL, select gate lines SGD and SGS, and a back gate line BG. The column decoder 4 selects, according to an address signal supplied from the control circuit AR4, addresses for writing and reading. The sense amplifier circuit 3 determines, during the read operation, data stored in a memory cell. The sense amplifier circuit 3 also drives, according to an address signal supplied from the control circuit AR2 via the column decoder 4, the bit line BL and the source line SL. With reference to FIG. 1B, the data register 5 includes, corresponding to one bit line BL, three latch circuits LAT1 to LAT3 and an arismetic circuit OP. The latch circuit LAT1 holds, in the data variation determination device described below, data read by supplying a certain voltage to the word line WL. The latch circuit LAT2 holds data read by supplying a different voltage to the word line WL. The arismetic circuit OP performs various operations between latch data sets. The latch circuit LAT3 latches the operation result of the arismetic circuit OP.

The control circuit AR2 has a function of controlling the voltage applied to the memory cell MTr or the like. Specifically, the control circuit AR2 includes, a driver 201 for driving the word line WL, the select gate lines SGD and SGS, and the back gate line BL, a driver 202 for driving the bit line BL and the source line SL, a charge pump circuit 203 for stepping up the power supply voltage to a certain step-up voltage, and an address decoder 204.

The control circuit AR2 performs an operation of writing data to the memory cell MTr, an erase operation of erasing data in the memory cell MTr, and an operation of reading data from the memory cell MTr.

With reference to FIG. 1A, the memory cell array AR1 includes an m-column memory block MB. Each memory block MB includes memory units MU arranged, for example, in a matrix of n rows and 2 columns.

Each memory unit MU includes the memory string MS, a source-side select transistor SSTr2 connected to the source-side of the memory string MS, and a drain-side select transistor SDTr2 connected to the drain-side of the memory string MS, and the back gate transistors BTr. Note that in the example shown in FIG. 1A, the first column of each memory unit MU is referred as a sub-block SB1, and the second column is referred to as a sub-block SB2. FIG. 1A illustrates an example where one memory block MB includes two sub-blocks SB1 and SB2. But of course the invention is not limited thereto, and one memory block MB may include three or more sub-blocks.

The m memory blocks MB share the same bit line BL. Specifically, the bit line BL extends in the column direction shown in FIG. 1A and is connected to the units MU (the drain-side select transistors SDTr) aligned in the column direction in the m memory blocks MB. In each memory block MB, two memory units MU arranged in the column direction are commonly connected to the same bit line BL.

Further, in each memory block MB, n×2 memory units MU share the corresponding word line WL and back gate line BG. Further, n memory units MU arranged in the row direction share the select gate line SGD and the select gate line SGS. Specifically, a plurality of memory units MU which include the drain-side select transistors SDTr and the source-side select transistors SSTr commonly connected to one drain-side select gate line SGD and one source-side select gate line SGS, respectively, form one sub-block.

With reference to FIG. 2, the memory cell array AR1 includes the memory cells MTr arranged in a three-dimensional matrix. Specifically, the memory cells MTr are arranged in a matrix in the horizontal direction as well as arranged in the lamination direction (in the vertical direction with respect to the substrate). The memory cells MTr0 to MTr7 and MTr8 to MTr15 and the back gate transistors BTr arranged in the lamination direction are connected in series to provide the above memory string MS.

Each memory string MS has a first end connected to the drain-side select transistor SDTr and a second end connected to the source-side select transistor SSTr. The drain-side select transistor SDTr and the source-side select transistor SSTr are provided to determine selection/unselection of the memory strings MS. The memory strings MS are arranged in the lamination direction as the longitudinal direction.

Figure 3:
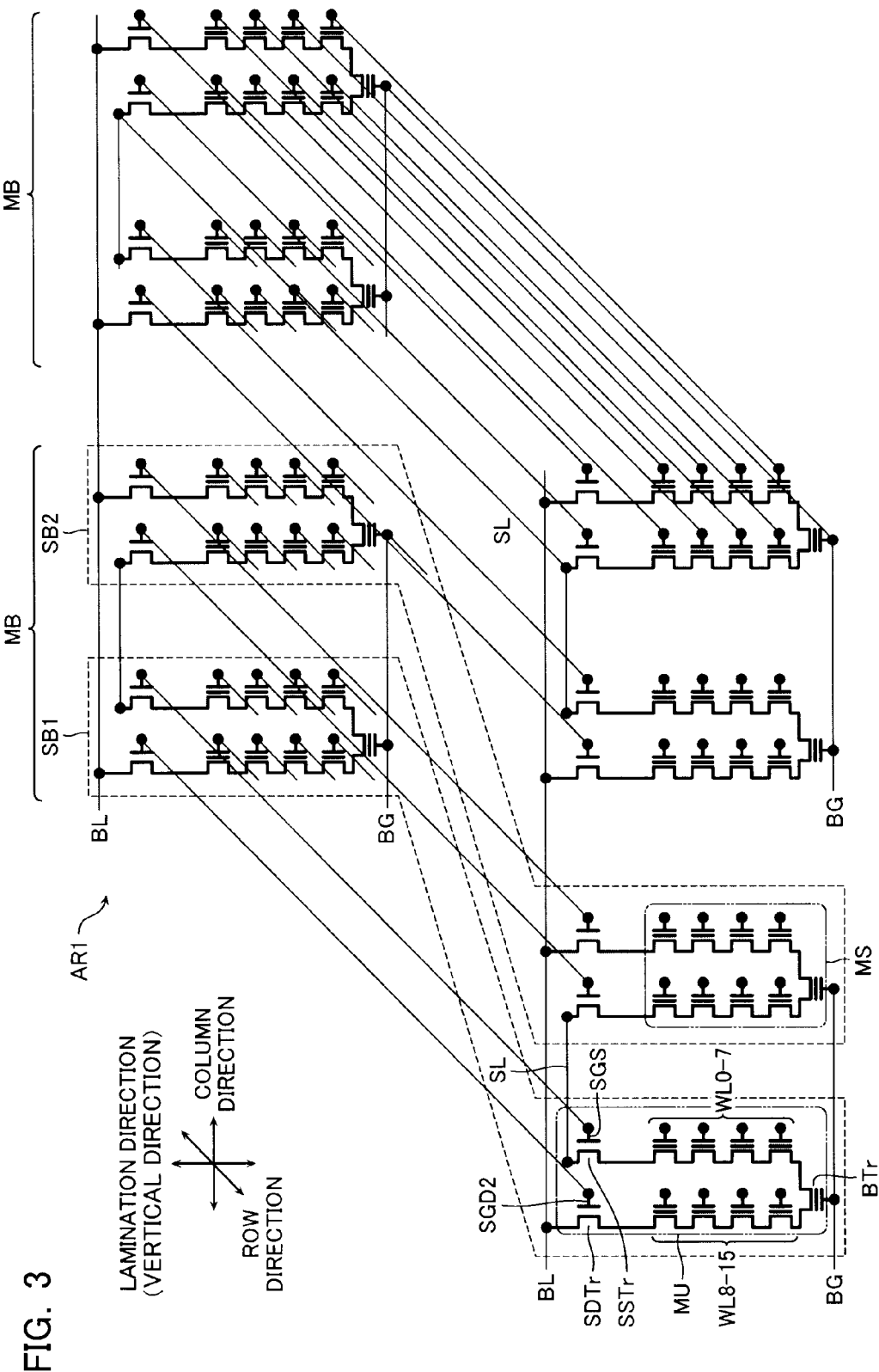
FIG. 3 is an equivalent circuit diagram of the circuitry of the memory cell array AR1 in FIG. 1.

Referring now to FIG. 3, the circuitry of the memory cell array AR1 will be specifically described. FIG. 3 is an equivalent circuit diagram of the memory cell array AR1. With reference to FIG. 3, the memory cell array AR1 includes the memory blocks MB. The bit lines BL are arranged in the row direction at a certain pitch and extend in the column direction in a stripe. With reference to FIG. 3, the memory blocks MB are repeatedly provided in the column direction.

Each memory block MB includes the memory units MU arranged in a matrix in the row direction and the column direction. Each memory unit MU includes the memory string MS, the source-side select transistor, SSTr, and the drain-side select transistor SDTr. The memory units MU are arranged in a matrix in the row direction and the column direction.

The memory string MS includes the memory cells MTr0 to MTr15 and the back gate transistor BTr. The memory cells MTr0 to MTr7 are connected in series in the lamination direction. The memory cells MTr8 to MTr15 are also connected in series in the lamination direction. The memory cells MTr0 to MTr15 each change the threshold voltage by a change of the charge amount accumulated in the charge accumulation layer. The threshold voltage change may rewrite data held in the memory cells MTr0 to MTr15. The back gate transistor BTr is connected between the memory cell MTr7 and the memory cell MTr8 in the bottom layer. Thus, the memory cells MTr0 to MTr15 and the back gate transistor BTr are connected in a U shape in a cross-section along the column direction. The source-side select transistor SSTr2 has a drain connected to a first end of the memory string MS (the source of the memory cell MTr15). The drain-side select transistor SDTr2 has a source connected to a second end of the memory string MS (the drain of the memory cell MTr0).

The gates of the n×2 memory cells MTr0 in one memory block MB are commonly connected to one word line WL0 extending in the row direction. Similarly, the gates of the n×2 memory cells MTr0 to MTr15 are commonly connected to the respective word lines WL1 to 15 extending in the row direction. The gates of the n×2 back gate transistors BTr arranged in a matrix in the row direction and the column direction are commonly connected to the back gate line BG.

The gates of the n source-side select transistors SSTr aligned in the row direction are commonly connected to one source-side select gate line SGS extending in the row direction. The source-side select transistor SSTr has a source connected to a source line SL extending in the row direction.

The gates of the n drain-side select transistors SDTr aligned in the row direction are commonly connected to one drain-side select gate line SGD extending in the row direction. The drain-side select transistor SDTr has a drain connected to a bit line BL extending in the column direction.

Figure 4:
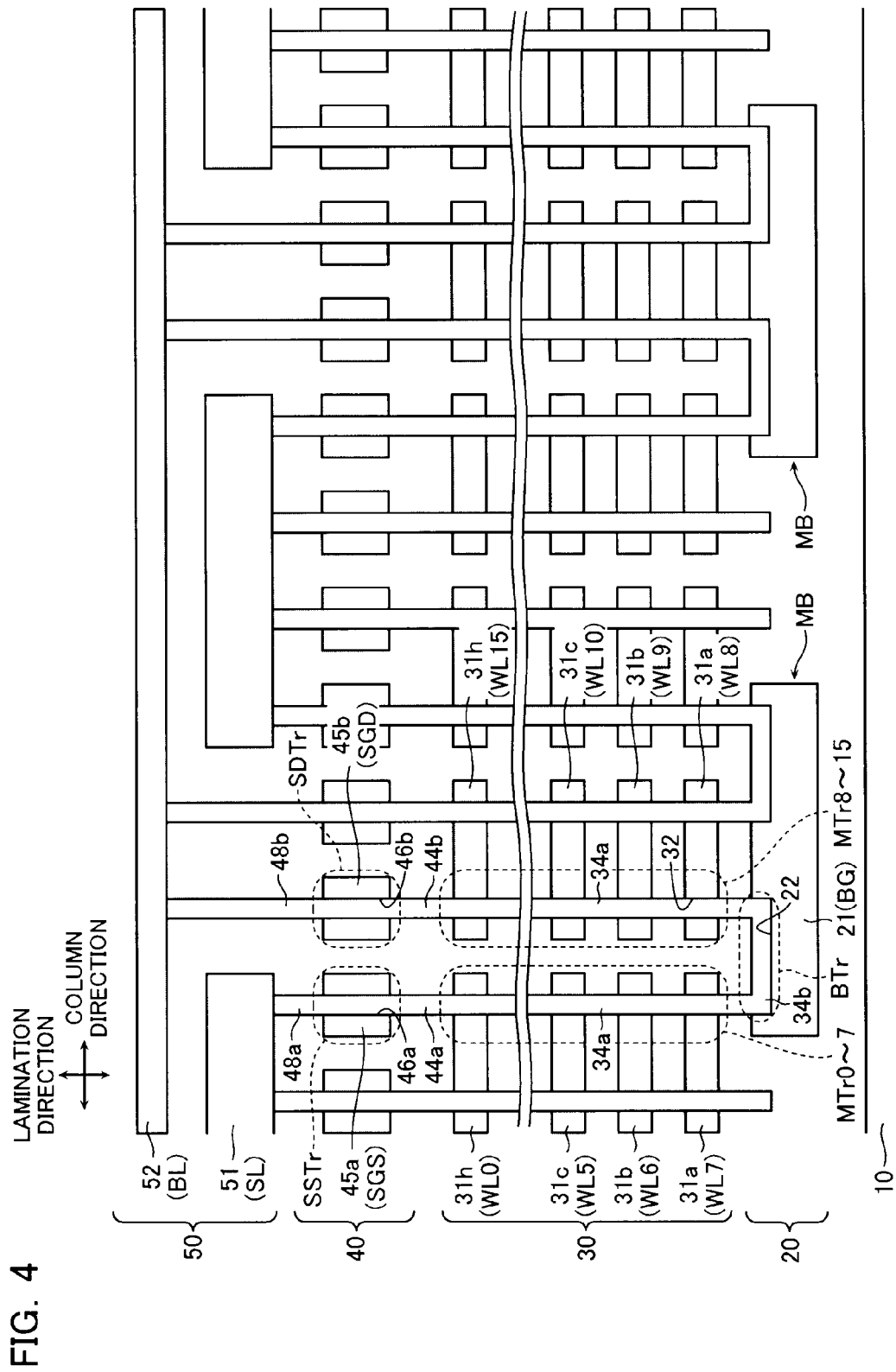
FIG. 4 is a schematic cross-sectional view of the memory block MB in the memory cell array AR1 in FIG. 1.
Figure 5A:
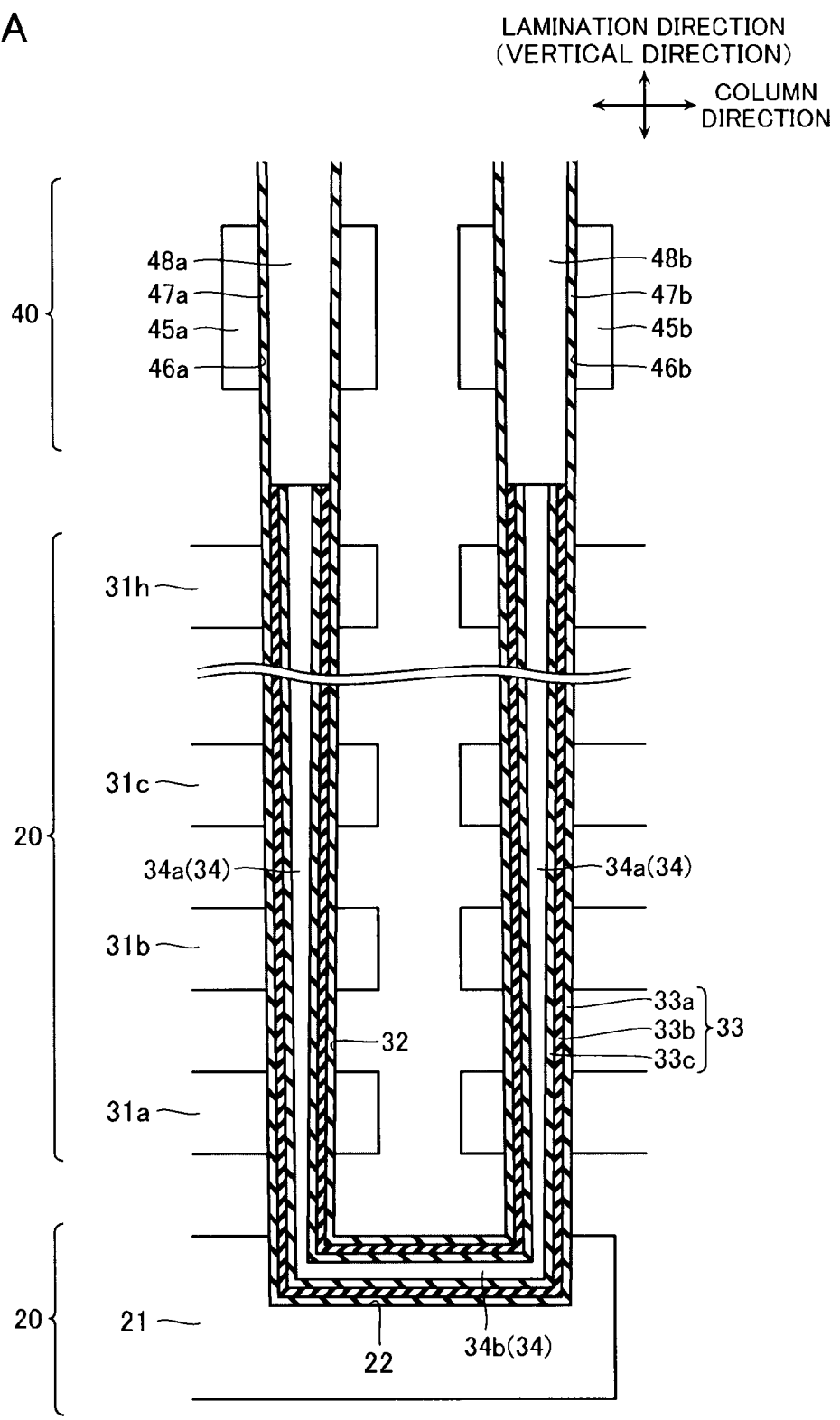
FIG. 5A is a schematic cross-sectional view of a memory unit MU in one memory block MB.
Figure 5B:
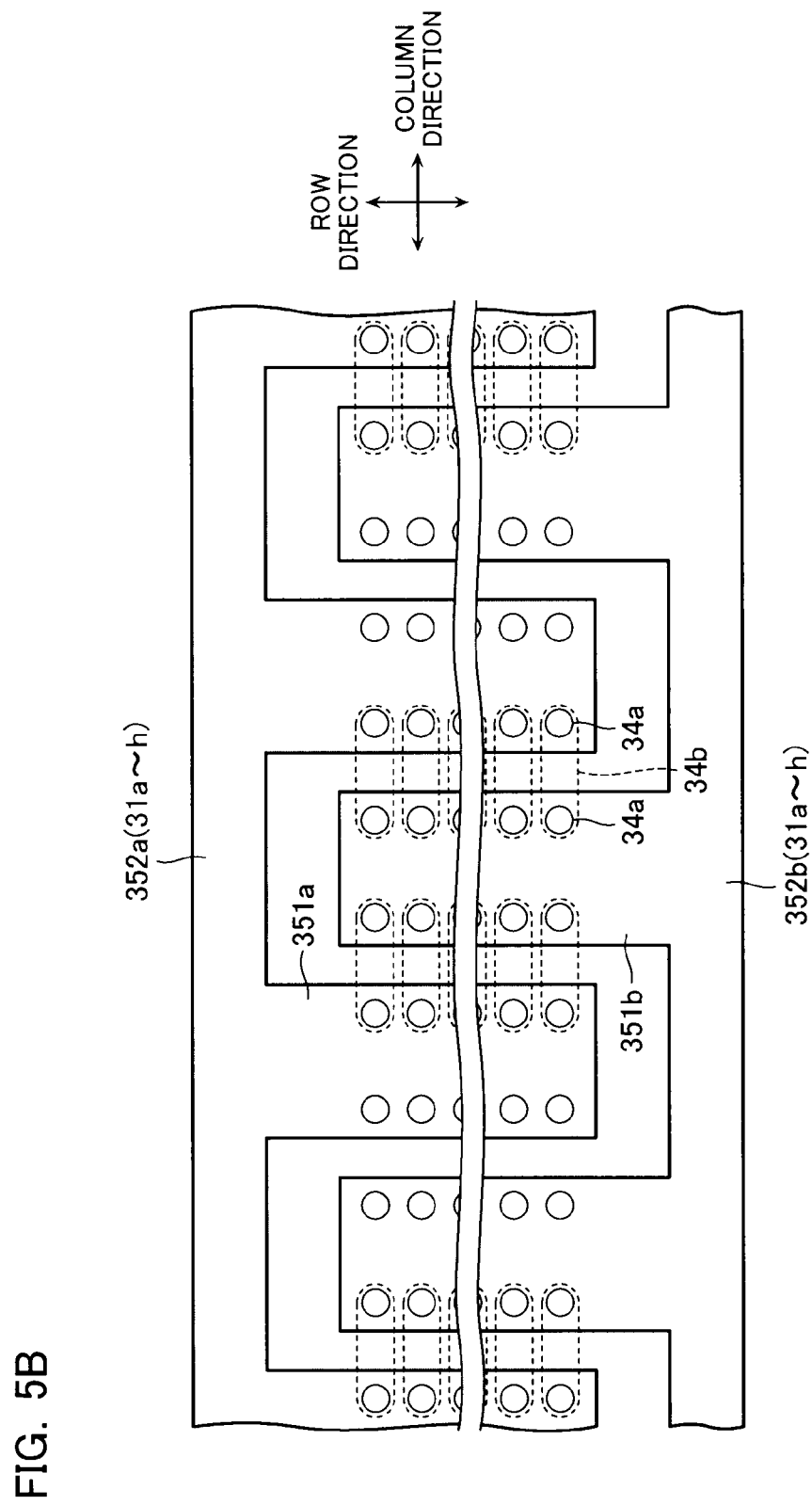
FIG. 5B is a plan view of one memory block MB.

Referring now to FIG. 4, FIG. 5A, and FIG. 5B, a description is given of the laminated structure of a non-volatile semiconductor memory device according to the first embodiment.

With reference to FIG. 4, the memory cell array AR1 includes a substrate 10 that bears a back gate transistor layer 20, a memory cell layer 30, a select transistor layer 40, and a interconnection layer 50 in this order. The back gate transistor layer 20 functions as the back gate transistors BTr. The memory cell layer 30 functions as the memory cells MTr0 to MTr15 (the memory string MS). The select transistor layer 40 functions as the source-side select transistor SSTr and the drain-side select transistor SDTr. The interconnection layer 50 functions as the source line SL and the bit line BL.

With reference to FIG. 5A, the back gate transistor layer 20 includes a back gate conductive layer 21. The back gate conductive layer 21 functions as the back gate line BG as well as the gate of the back gate transistor BTr. The back gate conductive layer 21 is formed in a plate extending two-dimensionally in the row direction and the column direction parallel with the substrate 10. The back gate conductive layer 21 is divided for each memory block MB. The back gate conductive layer 21 is formed of polysilicon (poly-Si).

With reference to FIG. 5A, the back gate conductive layer 20 includes a back gate semiconductor layer 34b (a coupling portion 34b). The back gate semiconductor layer 34b is embedded in a back gate hole 22. The back gate hole 22 is formed as trimming the back gate conductive layer 21. The back gate hole 22 is formed in a generally rectangular shape having the column direction as the longitudinal direction when seen in top plan view. The back gate hole 22 is formed in a matrix in the row direction and the column direction.

With reference to FIG. 4, the memory cell layer 30 is formed on the top layer of the back gate conductive layer 20. The memory cell layer 30 includes word line conductive layers 31a to 31h. The word line conductive layers 31a to 31h function as the word lines WL0 to WL15 as well as the gates of the memory cells MTr0 to MTr15.

The word line conductive layers 31a to 31h are laminated with interlayer insulating layers (not shown) therebetween. The word line conductive layer 31a to 31h are formed in the column direction at a certain pitch and are extending in the row direction as the longitudinal direction. The word line conductive layers 31a to 31h are formed of polysilicon (poly-Si). The interlayer insulating layers (not shown) formed between the conductive layers are each formed of, for example, a silicon oxide film.

With reference to FIG. 5A, the memory cell layer 30 includes a memory semiconductor layer 34. The memory semiconductor layer 34 is embedded in a memory hole 32. The memory hole 32 is formed passing through the word line conductive layers 31a to 31h and a not-shown interlayer insulating layer. The memory hole 32 is formed aligning with the vicinity of the end portion of the back gate hole 22 in the column direction. Note that when the memory hole 32 is formed by general lithography and anisotropic etching, it is often formed in a so-called taper shape, which gradually decreases in the pore diameter from the upper side to the lower side.

Further, with reference to FIG. 5A, the back gate transistor layer 20 and the memory cell layer 30 include a memory gate insulating layer 33 and a memory semiconductor layer 34. The memory semiconductor layer 34 functions as the bodies of the memory cells MTr0 to MTr15 (the memory string MS).

With reference to FIG. 5A, the memory gate insulating layer 33 is formed on the side of the back gate hole 22 and the memory hole 32 with a certain thickness. The memory gate insulating layer 33 includes a block insulating layer 33a, a charge accumulation layer 33b, and a tunnel insulating layer 33c. The charge accumulation by the charge accumulation layer 33b changes the threshold voltages of the memory cells MTr0 to MTr15, thus making it possible to rewrite data held in the memory cell MTr.

With reference to FIG. 5A, the block insulating layer 33a is formed on the side of the back gate hole 22 and the memory hole 32 with a certain thickness. The charge accumulation layer 33b is formed on the side of the block insulating layer 33a with a certain thickness. The tunnel insulating layer 33c is formed on the side of the charge accumulation layer 33b with a certain thickness. The block insulating layer 33a and the tunnel insulating layer 33c are formed of silicon dioxide ($SiO_2$). The charge accumulation layer 33b is formed of silicon nitride (SiN).

The memory semiconductor layer 34 is formed in contact with the side of the tunnel insulating layer 33c. The memory semiconductor layer 34 is formed to fill in the back gate hole 22 and the memory hole 33. The memory semiconductor layer 34 is formed in a U shape when viewed in the row direction. The memory semiconductor layer 34 includes a pair of columnar portions 34a extending in the vertical direction with respect to the substrate 10, and the coupling portion 34b coupling the lower ends of the pair of the columnar portions 34a. The memory semiconductor layer 34 is formed of polysilicon (poly-Si).

The above back gate transistor layer 20 has, in other words, a configuration in which the memory gate insulating layer 33 is formed surrounding the coupling portion 34b. The back gate conductive layer 21 is formed surrounding the coupling portion 34b via the memory gate insulating layer 33. Further, the above memory cell layer 30 has, in other words, a configuration in which the memory gate insulating layer 33 is formed surrounding the columnar portion 34a. The word line conductive layers 31a to 31d are formed surrounding the columnar portion 34a via the memory gate insulating layer 33.

With reference to FIG. 4, the select transistor layer includes a source-side conductive layer 45a and a drain-side conductive layer 45b. The source-side conductive layer 45a functions as the source-side select gate line SGS as well as the gate of the source-side select transistor SSTr. The drain-side conductive layer 45b functions as the drain-side select gate line SGD as well as the gate of the drain-side select transistor SDTr.

The source-side conductive layer 45a is formed in the periphery of the semiconductor layer 48a. The drain-side conductive layer 45b is in the same layer as the source-side conductive layer 45a and is also formed in the periphery of the semiconductor layer 48b. The source-side conductive layer 45a and the drain-side conductive layer 45b are formed of polysilicon (poly-Si).

With reference to FIG. 5A, the select transistor layer 40 includes a source-side hole 46a and a drain-side hole 46b. The source-side hole 46a is formed passing through the source-side conductive layer 45a. The drain-side hole 46b is formed passing through the drain-side conductive layer 45b. The source-side hole 46a and drain-side hole 46b are each formed at a position aligning with the memory hole 32.

With reference to the FIG. 5A, the select transistor layer 40 includes a source-side gate insulating layer 47a, a source-side columnar semiconductor layer 48a, a drain-side gate insulating layer 47b, and a drain-side columnar semiconductor layer 48b. The source-side columnar semiconductor layer 48a functions as the body of the source-side select transistor SSTr. The drain-side columnar semiconductor layer 48b functions as the body of the drain-side select transistor SDTr.

With reference to FIG. 4, the interconnection layer 50 is formed on the top layer of the select transistor layer 40. The interconnection layer 50 includes a source line layer 51 and a bit line layer 52. The source line layer 51 functions as the source line SL. The bit line layer 52 functions as the bit line BL.

The source line layer 51 is formed in a plate extending in the row direction. The source line layer 51 is formed in contact with the top surfaces of a pair of source-side columnar semiconductor layers 48a formed adjacent in the column direction. The bit line layer 52 is contact with the upper surface of the drain-side columnar semiconductor layer 48b. The bit line layer 52 is formed in a stripe arranged in the row direction at a certain pitch and is extending in the column direction. The source line layer 51 and the bit line layer 52 are formed of metal such as tungsten (W), copper (Cu), and aluminum (Al).

Referring now to FIG. 5B, the shapes of the word line conductive layers 31a to 31h will be described in more detail. FIG. 5B is a top view of the word line conductive layers 31a to 31h.

With reference to FIG. 5B, the word line conductive layers 31a to 31h are each formed in a comb shape when viewed from a vertical direction. The word line conductive layers 31a to 31h include a plurality of straight portions 351a and 351b, and straight portions 352a and 352b coupling the end portions of the straight portions 351a and 351b. The straight portions 351a and 351b surround the columnar semiconductor layers 34a arranged in the row direction.

In this way, the memory strings MS arranged in the bit line BL direction are commonly connected to one word line WL for each memory block. This is because it is necessary to reduce the number of metal interconnections for coupling the signals of the word line WL, the select gate lines SGD and SGS, and the back gate line BG to the peripheral circuits portions such as the row decoder.

Figure 6:
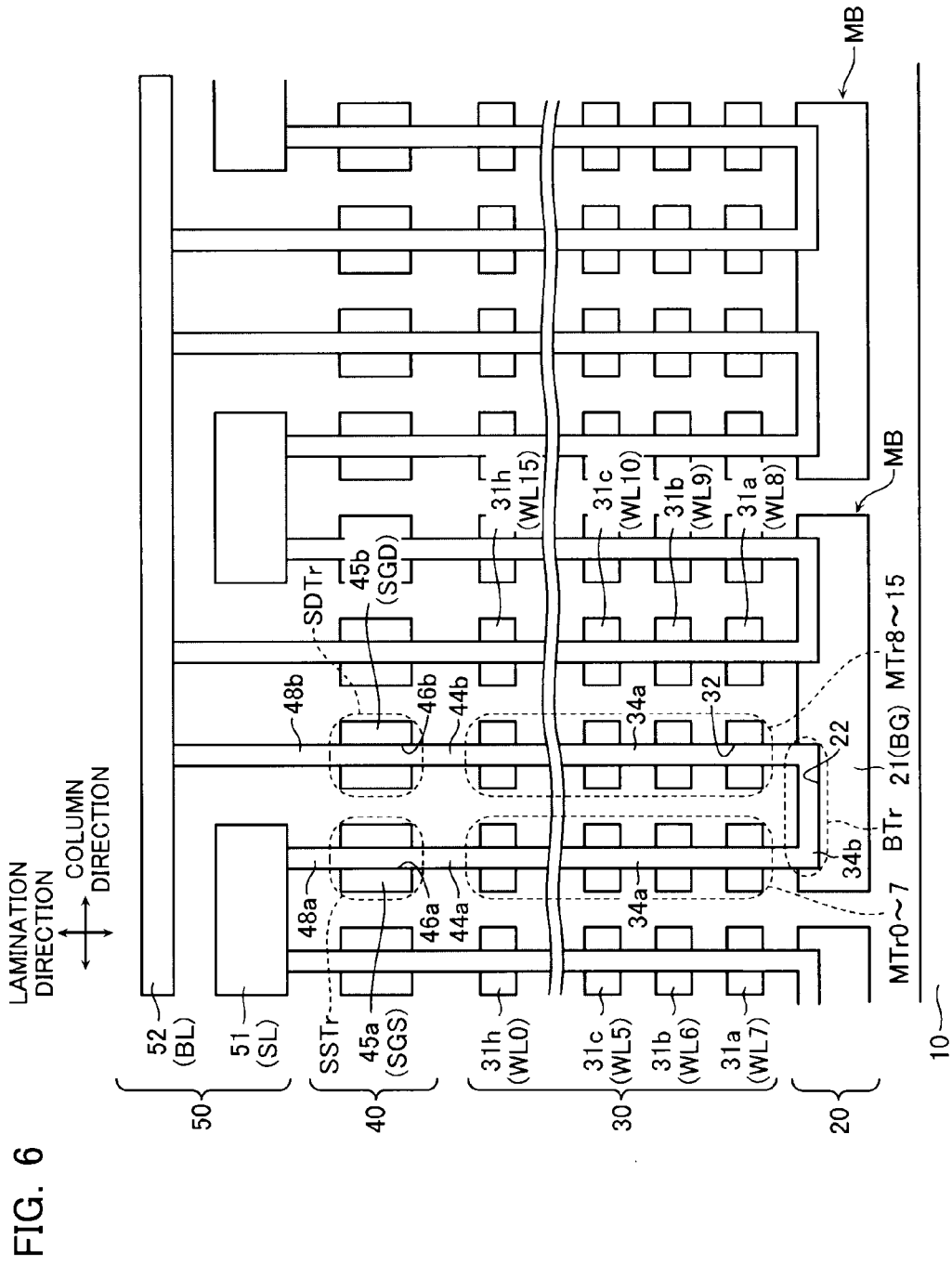
FIG. 6 is a schematic cross-sectional view of a different memory cell array.

FIG. 4 and FIG. 5B show an example where two memory strings MS arranged in the bit line BL direction are commonly connected to the same word line interconnection layers 31a to 31h. But a different configuration may be adopted in which as shown in FIG. 6 and FIG. 7, the memory strings MS arranged in the bit line BL direction are connected to the word line interconnection layers 31a to 31h divided for each memory string MS.

As described above, conventional semiconductor memory devices including memory cells in a three-dimensional arrangement are formed allowing a plurality of memory strings arranged in a matrix to share the same word line. This is because an independent word line formed for each one memory string will bloat the area of the row decoder and the area of a contact region for forming a contact for connecting a word line and the row decoder, thereby making it difficult to reduce the size of memory devices. The shearing of the word line contributes to, however, the read disturb during the read operation from and the program disturb during the write operation to the unselected memory strings in the selected block. In semiconductor memory devices including memory cells in a three-dimensional arrangement, therefore, measures for the read disturb or the like are even more important compared to two-dimensional semiconductor memory devices.

In three-dimensional semiconductor memory devices, the memory cells formed over a plurality of layers may make it hard to avoid the variation of the data-retention characteristics of the memory cells depending on the positions of the memory cells in the lamination direction. If the data-retention characteristics vary, the data-retention characteristics should be considered based on a page of the word line conductive layer having the worst data-retention characteristics. Specifically, if data variations have occurred in a memory cell of a page of a word line conductive layer having the worst data-retention characteristics, data copy needs to be done in units of a block because the erase is done in units of a block, even if no problems found in the other pages in the same block. The number of data copy operations thus increases. This results in reduced performance of the memory device. This embodiment addresses this problem using operations as described below.

[Multi-Level Storage in NAND Flash Memory]

Figure 8A:
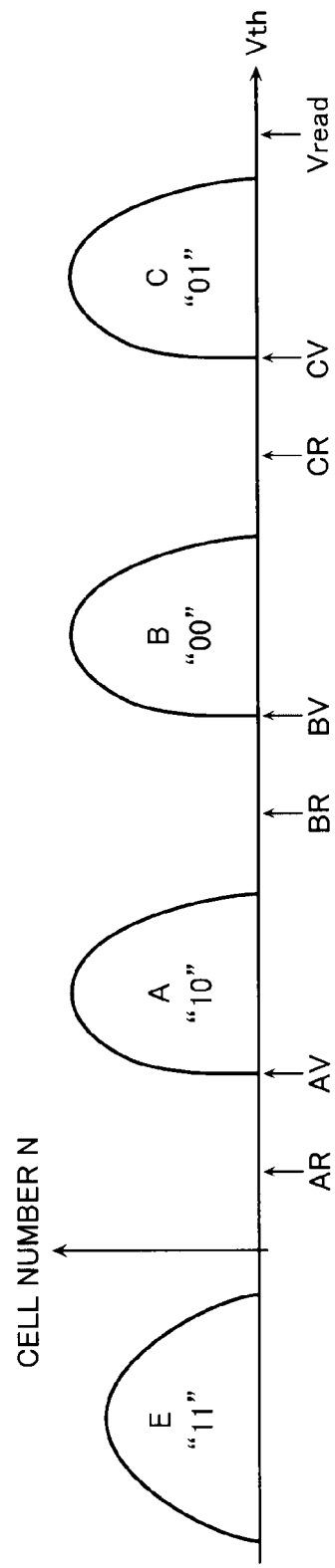
FIG. 8A is a state diagram of the threshold voltage distribution when storing two-bit information in one memory cell.

With reference to FIG. 8A, the multi-level storage in an NAND flash memory will be described below. In the NAND flash memory, for example as shown in FIG. 8A, the value of the threshold voltage of one memory cell may be controlled to, for example, 4 levels (threshold voltage distributions of E, A, B, and C), thereby allowing two-bit data to be stored in one memory cell. A description will be given below with respect to a four-level storage as an example. It should be understood, however, that the present invention is applicable to a multi-level storage including eight-level (3 bits) or more other than the four-level storage.

FIG. 8A shows four threshold voltage distributions E, A, B, and C, which correspond to the respective two-bit data sets "11," "10," "00," and "01." Specifically, the 4 levels of threshold voltage distributions (E, and A to C) are assigned with any of the 4 sets of bit information (11, 10, 00, and 01). Corresponding to two-bit data, two sub pages are formed. Specifically, 2-page data of an upper page UPPER and a lower page LOWER may be stored in n memory cells MTr arranged in one word line WL.

[Data Read]

The data read operation is performed by supplying the selected word line WL (select) with the read voltage to detect where the memory cell MC is rendered conductive or non-conductive. The voltage value of the read voltage applied to the selected word line WL (select) may be set to, in response to the 4 levels of threshold voltage distributions of the memory cell, the voltages AR, BR, and CR as shown in FIG. 8A. The read voltage AR is the lowest voltage. The voltage value increases in the order of BR and CR. The voltage AR is used to determine whether the threshold voltage is equal to or more than the threshold voltage distribution A. The voltage BR is used to determine whether the threshold voltage is equal to or more than the threshold voltage distribution B. The voltage CR is used to determine whether the threshold voltage is included in the threshold voltage distribution C. Note that the read-pass voltage Vread applied to an unselected memory cell MC (unselect) during the read operation is set to a voltage higher than the upper limit of the threshold voltage distribution C assigned with data "01."

[Write Operation]

The multi-level data write operation will now be described. The selected word line WL (select) connected to the selected memory cell MTr (select) in the memory string MS is applied with a programming voltage Vpgm of, for example, 20 V or more. The unselected word line WL (unselect) connected to the unselected memory cell MTr (unselect) is applied with a pass voltage Vpass of, for example, about 10 V. The bit line BL is provided with the power supply voltage Vdd or the ground voltage Vss depending on whether the write is performed or inhibited.

Further, the select gate line SGD of the drain-side select transistor SDTr is provided a voltage slightly higher than the power supply voltage Vdd. In a memory string MS connected to the bit line BL provided with the ground voltage Vss, the drain-side select transistor SDTr first changes to a conductive state (ON). The channel of the memory string MS thus changes to the ground voltage Vss. The potential difference with respect to the programming voltage Vpgm causes writing in the select transistor MTr. In a memory string MS connected to the bit line BL provided with the power supply voltage Vdd, the drain-side select transistor SDTr changes to a non-conductive state (OFF). The channel of the memory string MS thus changes to the floating state, thereby inhibiting write operation.

[Verify Read Operation]

After the above write operation, a verify read operation is performed to determine whether the write of the desired data is completed. The verify read operation applies, for example, a word line WL (select) connected to the selected memory cell MTr with the verify voltages AV, BV, and CV as shown in FIG. 8A, and applies a word line WL (unselect) connected to the unselected memory cell MTr with the above read-pass voltage Vread. The verify voltages AV, BV, and CV are higher than the respective read voltages AR, BR, and CR. The voltage magnitude relationship is AR<AV<BR<BV<CR<CV<Vread. If the result of the verify read operation using the above verify voltages AV, BV, and CV is that the lower limits of the threshold voltage distributions A, B, and C are generally equal to or more than the verify voltages AV, BV, and CV, respectively, it is determined that the write operation is completed.

Figure 8B:
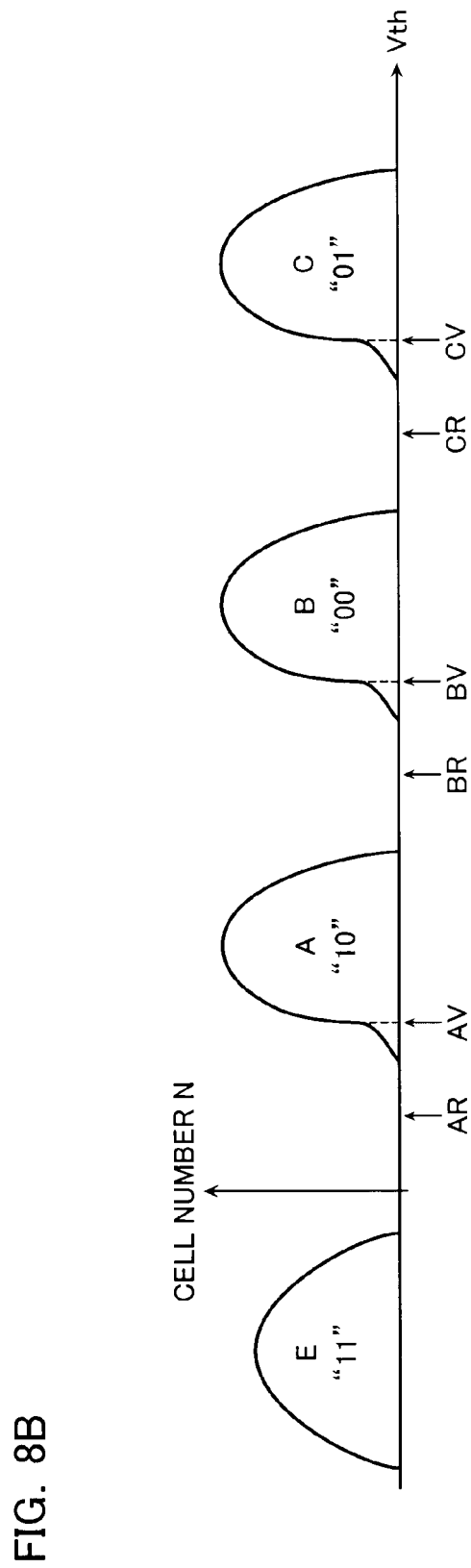
FIG. 8B shows a variation of the threshold voltage distribution.
Figure 8C:
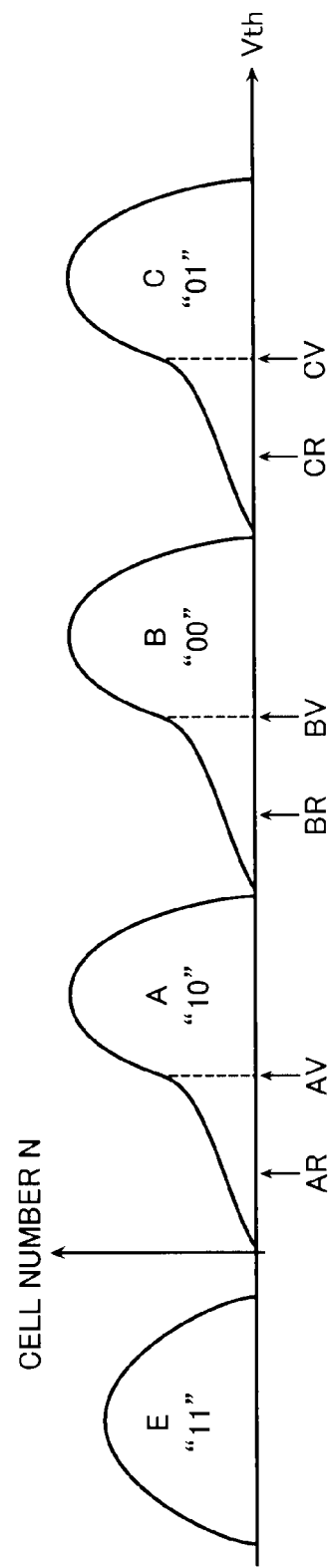
FIG. 8C shows a variation of the threshold voltage distribution.

After the above write operation is performed, the threshold voltage distributions A, B, and C may vary as shown in FIG. 8B and FIG. 8C due to various factors including capacitive coupling between adjacent interconnections, the change over time, and others. FIG. 8B shows that the lower limits of the threshold voltage distributions A, B, and C are below the respective verify voltages AV, BV, and CV. FIG. 8C shows that the variation of the threshold voltage distributions A, B, and C further proceeds and their lower limits are below the respective read voltages AR, BR, and CR.

If the variation of the threshold voltage distribution proceeds to the degree shown in FIG. 8C, data held in the memory cell MTr that is actually "01" may be accidentally read, for example, as data "00" as a result of the read operation by the application of the voltage CR. Specifically, read data different from originally written data is obtained (data variation). In other words, the read operation in such a memory cell MTr has misreading. Note, however, that a small number of misread data sets may be corrected with an error correction technology using parity data correction.

A large number of misread data sets, however, may not be dealt with by the error correction technology. Before, therefore, the number of misread data sets becomes out of the range correctable by the error correction technology, a block copy operation for regular copies to a different memory block or the like should be performed. In this block copy operation, the copy-source data is corrected by the error correction technology and is then written in a different block, thereby refreshing data.

In a three-dimensional structure (stacked) non-volatile semiconductor memory device according to this embodiment, for example, the memory cells MTr included in one memory block MB have different data-retention characteristics, particularly, largely different data-retention characteristics in the lamination direction. Specifically, the memory cells MTr0 to MTr15 in one memory string MS are formed at different positions in the lamination direction, and have different data-retention characteristics depending on the position in the lamination direction. This is, in part, because the memory hole 32 is formed in a taper shape.

If the memory hole is formed in a taper shape, the lower memory cells MTr7 and MTr8 of the memory string MS tend to have worse data-retention characteristics than the upper memory cell MTr0 or the like. In such a situation, implementation of the above block copy operation adapting to the memory cells MTr7 and MTr8 having worse data-retention characteristics will increase the implementation frequency of the block copy operation, thereby reducing the performance of the non-volatile semiconductor memory device.

A non-volatile semiconductor memory device in this embodiment performs an operation for determining whether the memory cells MTr along one word line WL have a certain number of data variations or more (hereinafter, the operation is referred to as a "data variation determination operation"). If the data variation determination operation determines that among the memory cells MTr along one word line WL, a certain number of memory cells MTr or more have data variation, a write operation (hereinafter, referred to as an "additional write operation") is performed to the memory cells MTr along the word line WL to obtain the threshold voltage distribution immediately after the write operation as shown in FIG. 8A.

Figure 9:
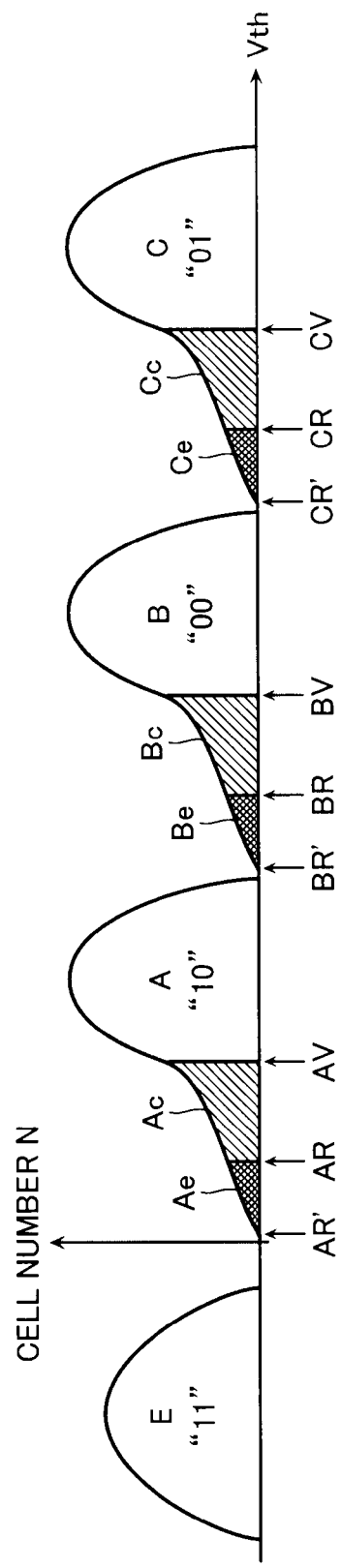
FIG. 9 is a schematic diagram generally illustrating a data variation determination operation according to the first embodiment.

FIG. 9 is a schematic diagram generally illustrating a data variation determination operation according to this embodiment. In the data variation determination operation according to this embodiment, the read operation is performed by supplying the sequentially selected word lines WL with voltages AR' (<AR), BR' (<BR), and CR' (<CR) lower than the respective read voltages AR, BR, and CR, and voltages (for example, the read voltages AR, BR, and CR) higher than the respective voltages AR', BR', and CR'.

It may thus be possible to determine the presence or absence of a memory cell MTr having a threshold voltage higher than the voltage AR' and lower than the voltage AR (the presence or absence of the distribution Ae in FIG. 9). Presence of a memory cell MTr having a threshold voltage included in the distribution Ae means that the memory cell MTr has data variation. Similarly, it may be possible to determine the presence or absence of a memory cell MTr having a threshold voltage higher than the voltage BR' and lower than the voltage BR (the presence or absence of the distribution Be in FIG. 9). It may also be possible to determine the presence or absence of a memory cell MTr having a threshold voltage higher than the voltage CR' and lower than the voltage CR (the presence or absence of the distribution Ce in FIG. 9). Hereinafter, the distributions Ae, Be, and Ce are referred to as "data variation distributions."

If it is confirmed that in the selected word line WL, a certain number of memory cells MTr or more have the data variation distributions Ae, Be, and Ce, and then in the selected word line WL, a write operation (the additional write operation) is performed to return the threshold voltage distributions to the distributions immediately after the write operation as shown in FIG. 8A. In this embodiment, the additional write operation is performed not only to the memory cells MTr having the data variation distributions Ae, Be, and Ce as described above, but to the memory cells MTr having distributions Ac, Bc, and Cc between the normal threshold voltage distributions and the data variation distributions Ae, Be, and Ce. This is because it is considered that the memory cell MTr having the distributions Ac, Bc, or Cc probably causes data variation (hereinafter, the distributions Ac, Bc, and Cc are referred to as "data degradation distributions").

A read operation (the additional write necessity determination operation) for identifying the memory cell MTr having the distributions Ae, Be, or Ce or the memory cell MTr having the distributions Ac, Bc, or Cc is followed by the additional write operation. The additional write necessity determination operation is performed by, for example, sequentially supplying the voltages AR', BR', and CR' and the verify voltages AV, BV, and CV to the selected word lines WL to perform the read operation. In this way, the necessity of the additional write operation is determined for each memory cell, and then the additional write operation is performed. The additional write operation may eradicate the data variation distributions Ae, Be, and Ce or the data degradation distributions Ac, Bc, and Cc, thereby providing the normal threshold voltage distributions A, B, and C having lower limits near the verify voltages AV, BV, and CV.

Referring now to the flowchart in FIG. 10, a specific execution procedure of the data variation determination operation and the additional write operation according to the first embodiment will be described.

Figure 10:
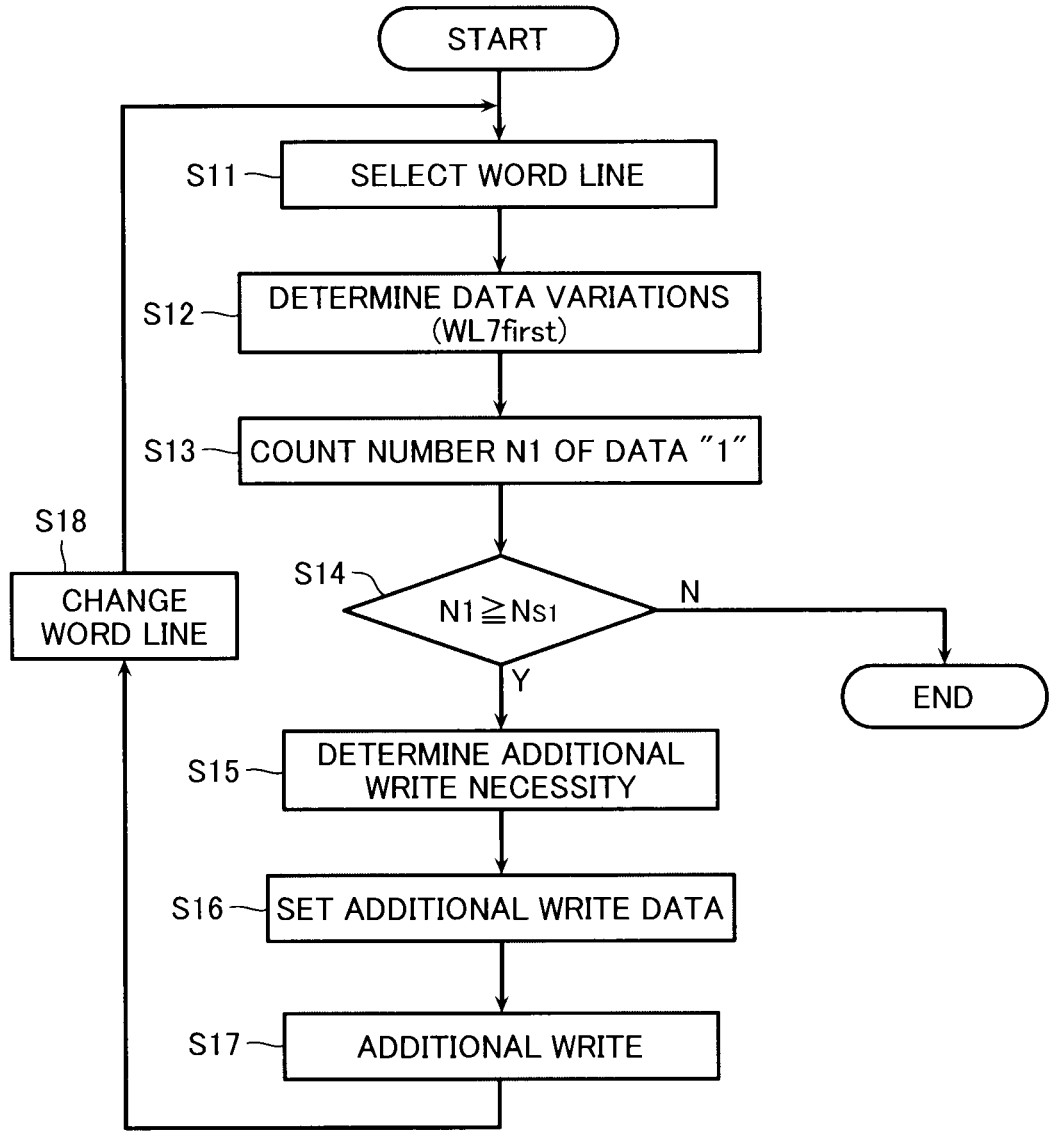
FIG. 10 is a flowchart of a specific execution procedure of the data variation determination operation and an additional write operation according to the first embodiment.

Referring to FIG. 10, one word line WL is first selected (S11), and the selected word line WL is subjected to the data variation determination operation (S12). For example, the first selected word line WL may be the word line WL7 connected to the memory cell MTr7 in the bottom layer. The memory cell MTr7 have worse data-retention characteristics than the other memory cells. If, therefore, it is determined that the additional write operation is unnecessary to the memory cell MTr7, it is also determined that the additional write operation is also unnecessary to the other memory cells. Note, however, that any of the word lines WL of one memory string MS may be first selected.

During the data variation determination operation, in the memory cell MTr having data variation, the corresponding latch circuit LATS stores data "1." In the memory cell MTr having no data variation, the corresponding latch circuit LAT3 stores data "0." The control circuit AR2 counts the number N1 of, among the memory cells MTr along the word line WL7, memory cells that output data "1" (S13), and determines whether the number N1 is equal to or more than the reference value Ns1 (S14).

If the number N1 is less than the reference value Ns1, the data variation determination operation and the additional write operation to the memory block MB are ended (Y in S14), and the data variation determination operation to the other word lines is not performed. This is because, for example, the memory cell MTr connected to the word line WL7 should have the worst data-retention characteristics, and so if the data variation number N1 is less than the certain number Ns1 in the word line WL7, it may be estimated without the need of the determination operation that data variations equal to or more than the reference value Ns1 do not occur in the other word lines WL.

If the number N1 is equal to or more than the reference value Ns1, the additional write operation continues to be performed in the word line WL. Before the additional write operation, a read operation (i.e., the additional write necessity determination operation for identifying the memory cell needing the additional write) is performed. The additional write necessity determination operation is performed to identify, in the word line WL, a memory cell MTr having already had data variations and a memory cell MTr having "data degradation" (in other words, a memory cell MTr having the distributions Ae, Be, and Ce, and a memory cell having the distributions Ac, Bc, and Cc) (S15). Then, the latch circuits LAT1 and LAT2 corresponding to the memory cell MTr that is determined to be subject to the additional write operation are set with additional write data to be written (S16), and the additional write operation is performed (S17), with a command being issued. Then, the same steps are performed for the other word lines WL (S18).

Figure 11:
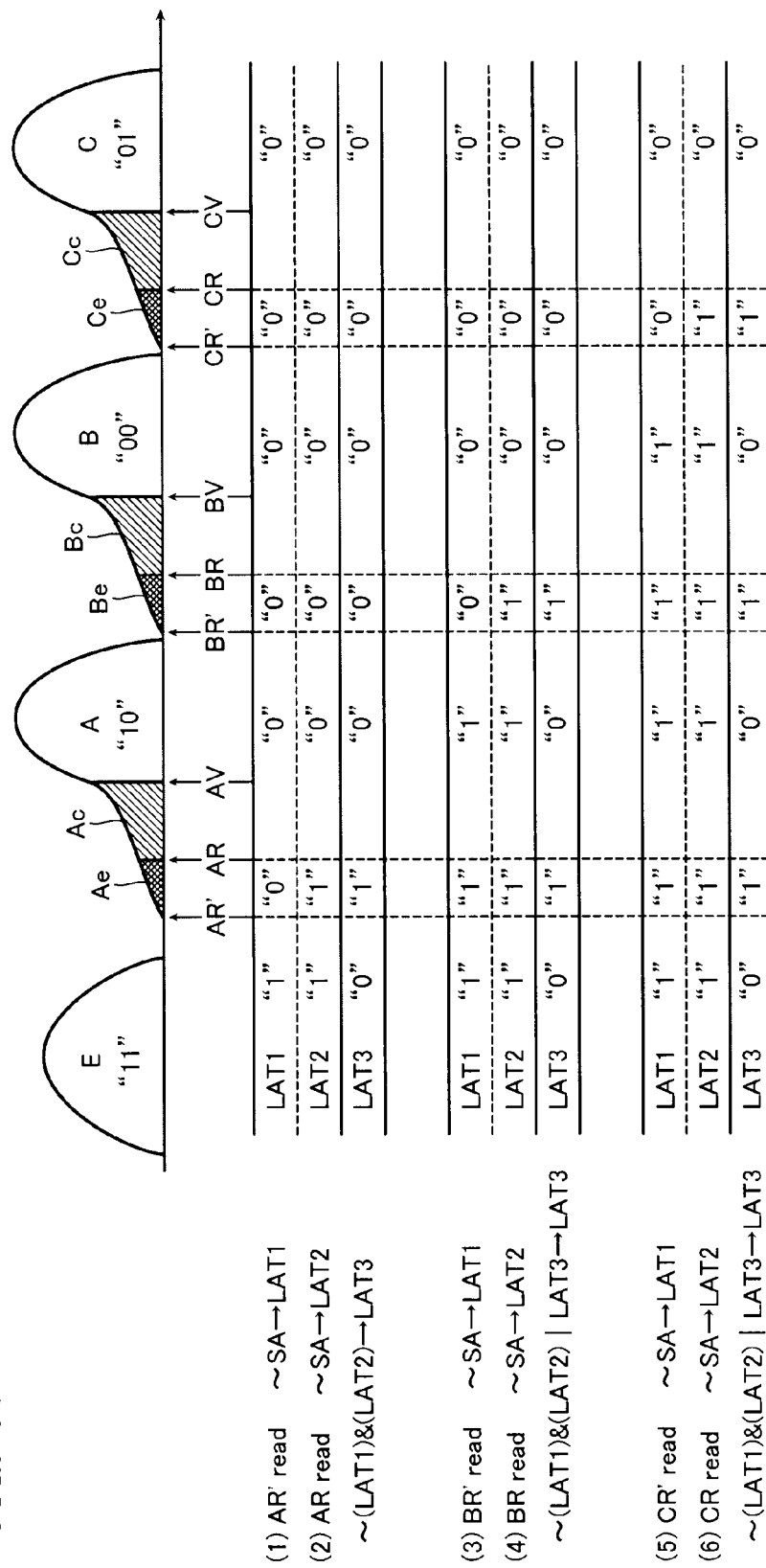
FIG. 11 illustrates a specific example of a data latch operation and an arithmetic operation performed in the data variation determination operation (S12) in FIG. 10.
Figure 12:
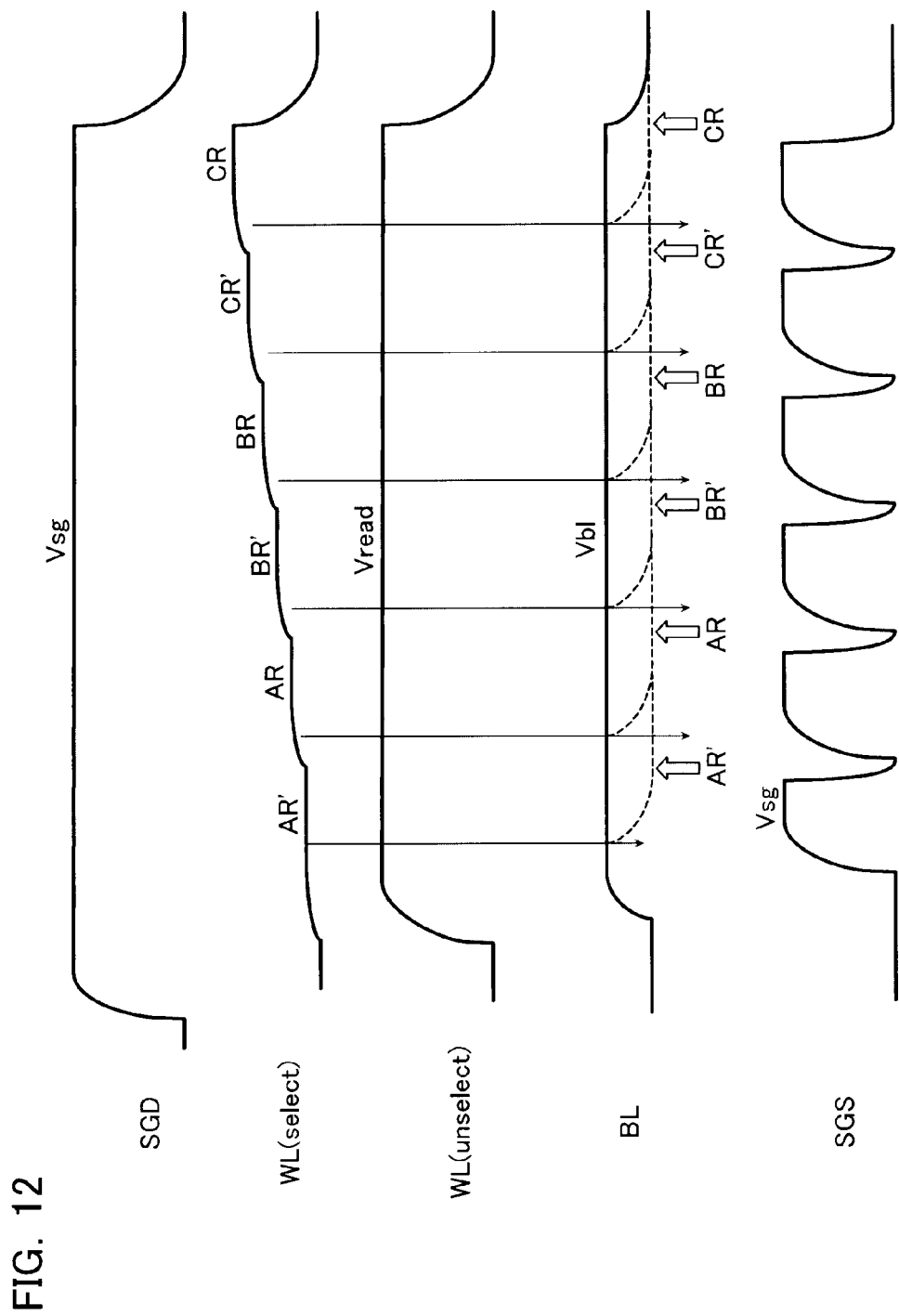
FIG. 12 is a timing diagram of changes of voltages applied to a word line WL, a bit line BL, and select gate lines SGD and SGS in the data variation determination operation shown in FIG. 11.

FIG. 11 illustrates a specific example of the data latch operation and the arithmetic operation performed in the data variation determination operation (S12). FIG. 12 is a timing diagram of changes of the voltages applied to the word line WL, the bit line BL, and the select gate lines SGD and SGS in the data variation determination operation shown in FIG. 11.

As described above, the data variation determination operation is performed by supplying 6 level voltages of AR', AR, BR', BR, CR', and CR to the selected word line WLi ($i \neq 0$ to 15) to perform the read operation (the unselected word line WLj (j [!=] i) is applied with the read-pass voltage Vread). FIG. 12 shows a timing diagram of the application of the 6 level voltages to the word line WL in ascending order of voltage level (AR', AR, BR', BR, CR', and CR). It will be understood, however, that this is only by way of example, and the voltage application procedure is not limited thereto. It will also be understood that the arithmetic operation and the data latch procedure are not limited to those in FIG. 11.

FIG. 11 and FIG. 12 show an example where the selected word line WL (select) is applied with the voltages AR', AR, BR', BR, CR', and CR in this order (FIG. 12). The unselected word lines WL (unselect) are provided with the read-pass voltage Vread. The bit lines BL are provided with a voltage Vb1 of about 1V. If the voltage applied to the selected word line WL (select) is higher than the threshold voltage of the selected memory cell MTr, the bit line BL is discharged from the voltage Vb1 to the ground voltage Vss.

The select gate line SGD is always provided with a voltage Vsg (3 to 4.5 V) higher than the voltage Vb1 to always maintain the drain-side select transistor SDTr in a conductive state (ON). The voltage provided to the select gate line SGS switches, in synchronism with the switching timing of the voltage of the selected word line WL (select), between the voltage Vsg and the ground voltage Vss, thereby switching the source-side select transistor SSTr between the conductive state (ON) and the non-conductive state (OFF).

With reference to FIG. 11, presence of a memory cell MTr that is not rendered conductive at the voltage AR' but is rendered conductive at the voltage AR means that there exists data variation of the threshold voltage distribution A in the memory cell MTr. Similarly, presence of a memory cell MTr that is not rendered conductive at the voltage BR' but is rendered conductive at the voltage BR means that there exists data variation of the threshold voltage distribution B. Also, presence of a memory cell MTr that is not rendered conductive at the voltage CR' but is rendered conductive at the voltage CR means that there exists data variation of the threshold voltage distribution C. FIG. 11 shows an example where the data latch operation and the arithmetic operation are performed to allow the latch circuit LAT3 corresponding to the memory cell MTr having data variation to store data "1," and the other latch circuits to store data "0." With reference to FIG. 11, the data latch operation and the arithmetic operation will be described below.

Referring to (1) in FIG. 11 and FIG. 12, the selected word line WL (select) is first applied with the voltage AR' for the read operation, and inverted data ($\approx$SA) of latch data of the sense amplifier circuit 3 is stored in the latch circuit LAT1. In this case, if the threshold voltage of the memory cell MTr is within the threshold voltage distribution E, the latch circuit LAT1 stores data "1," otherwise stores "0".

Referring to (2) in FIG. 11 and FIG. 12, the selected word line WL (select) is then applied with the voltage AR for the read operation, and inverted data (≈SA) of latch data of the sense amplifier circuit 3 is stored in the latch circuit LAT2. In this case, if the threshold voltage of the memory cell is within the threshold voltage distribution E or within the data variation distribution Ae, the latch circuit LAT1 stores data "1," otherwise stores "0."

The arismetic circuit OP arithmetically operates logical AND of inverted data of held data of the latch circuit LAT1 and held data of the latch circuit LAT2, and stores the operation result in the latch circuit LAT3. Thus, only the latch circuit LAT3 corresponding to the memory cell MTr having the data variation distribution Ae stores data "1," and the others store data "0."

Referring to (3) in FIG. 11 and FIG. 12, the selected word line WL (select) is then applied with the voltage BR' for the read operation, and inverted data (≈SA) of latch data of the sense amplifier circuit 3 is stored in the latch circuit LAT1. Referring to (4) in FIG. 11 and FIG. 12, the selected word line WL (select) is further applied with the voltage BR for the read operation, and inverted data (≈SA) of latch data of the sense amplifier circuit 3 is stored in the latch circuit LAT2. The arismetic circuit OP arithmetically operates logical AND of inverted data of held data of the latch circuit LAT1 and held data of the latch circuit LAT2, and then arithmetically operates logical OR of that logical AND data and held data of latch circuit LAT3. The operation result is newly stored in the latch circuit LAT3. Thus, only the latch circuit LAT3 corresponding to the memory cell MTr having the data variation distribution Be stores data "1."

Referring to (5) in FIG. 11 and FIG. 12, the selected word line WL (select) is then applied with the voltage CR' for the read operation, and inverted data (≈SA) of latch data of the sense amplifier circuit 3 is stored in the latch circuit LAT1. Referring to (6) in FIG. 11 and FIG. 12, the selected word line WL (select) is further applied with the voltage CR for the read operation, and inverted data (≈SA) of latch data of the sense amplifier circuit 3 is stored in the latch circuit LAT2. The arismetic circuit OP arithmetically operates logical AND of inverted data of held data of the latch circuit LAT1 and held data of the latch circuit LAT2, and then arithmetically operates logical OR of that logical AND data and held data of the latch circuit LAT3. The operation result is newly stored in the latch circuit LAT3. Thus, the latch circuit LAT3 corresponding to the memory cell MTr having the data variation distribution Ce stores data "1." As described above, the voltage application, the data latch operation, and the arithmetic operation may be performed to identify the memory cell MTr having the data variation distribution Ae, Be, or Ce.

Figure 13:
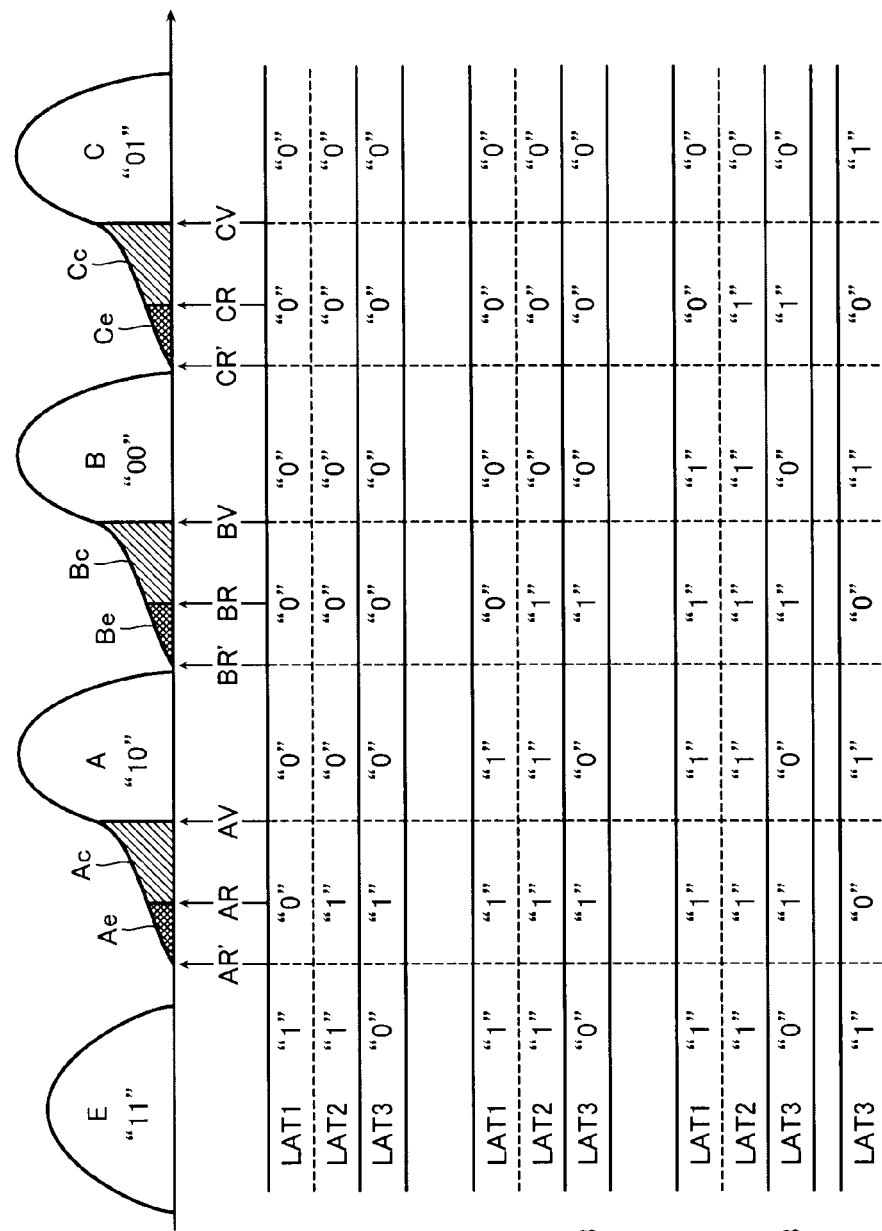
FIG. 13 illustrates a specific example of the data latch operation and the arithmetic operation performed in the additional write necessity determination operation (S15) in FIG. 10.
Figure 14:
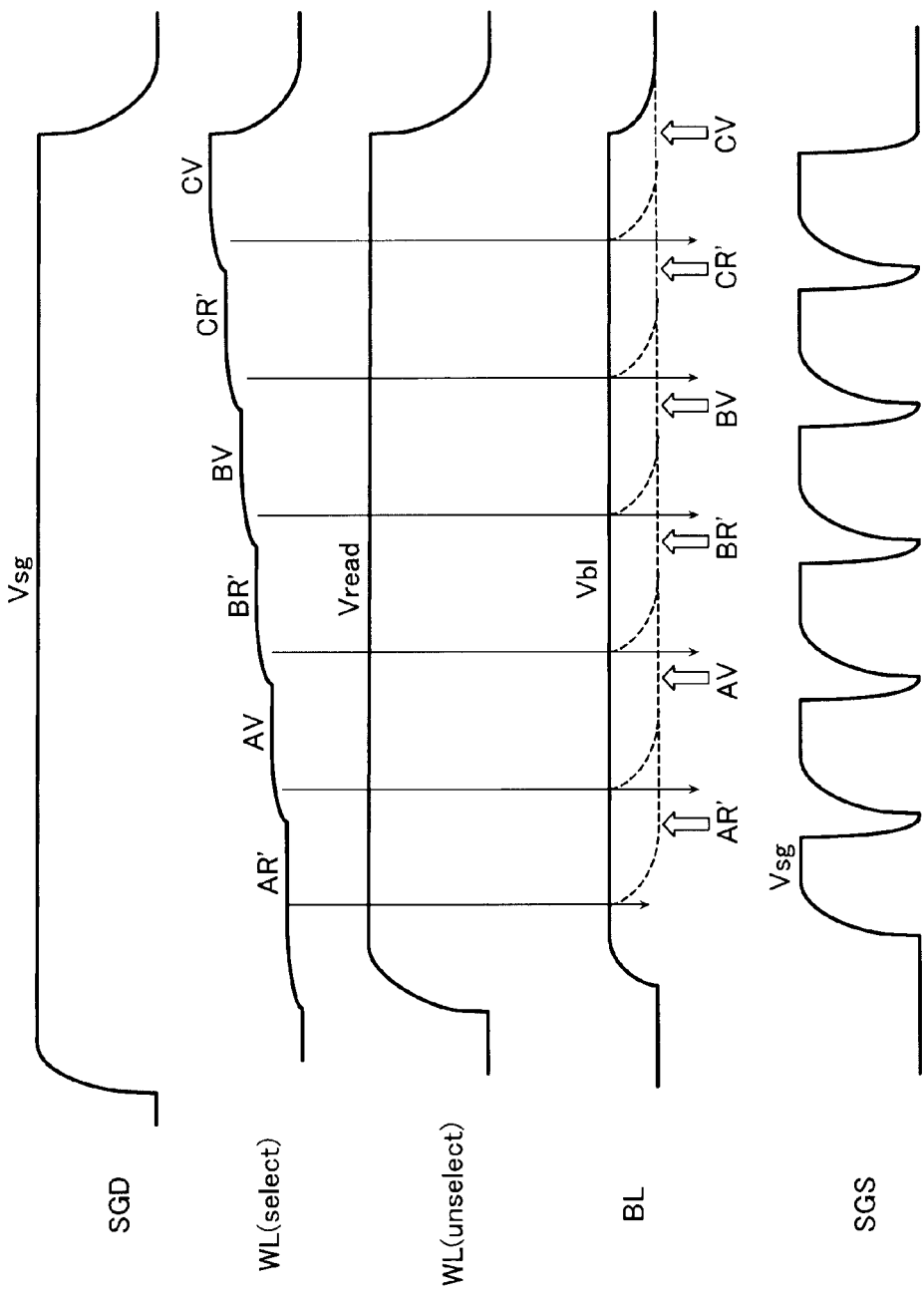
FIG. 14 is a timing diagram of changes of voltages applied to the word line WL, the bit line BL, and the select gate lines SGD and SGS in the additional write necessity determination operation shown in FIG. 13.

FIG. 13 illustrates a specific example of the data latch operation and the arithmetic operation performed in the additional write necessity determination operation (S15). FIG. 14 is a timing diagram of changes of the voltages applied to the word line WL, the bit line BL, and the select gate lines SGD and SGS in the additional write necessity determination operation shown in FIG. 13. The voltage application operation, the data latch operation, and the arithmetic operation are all generally the same as those in the data variation determination operation. The different point is that the selected word line WL is not applied with the voltages AR, BR, or CR, but is applied with the voltages AV, BV, and CV. The voltages AR', AV, BR', BV, CR', and CV are sequentially applied to the selected word line WL (select), a data latch operation and an arithmetic operation similar to those in FIG. 11 are performed, and finally, data of the latch circuit LAT3 is inverted. The latch circuit LAT3 corresponding to the memory cell MTr having the data variation distributions Ae, Be, and Ce and the data degradation distributions Ac, Bc, and Cc latches data "0," and the other latch circuits latch data "1." Only the memory cell MTr corresponding to the latch circuit LAT3 that has latched data "0" is subjected to the additional write operation. For the memory cell MTr corresponding to the latch circuit LAT3 that has latched data "1", the additional write operation is inhibited.

Figure 15:
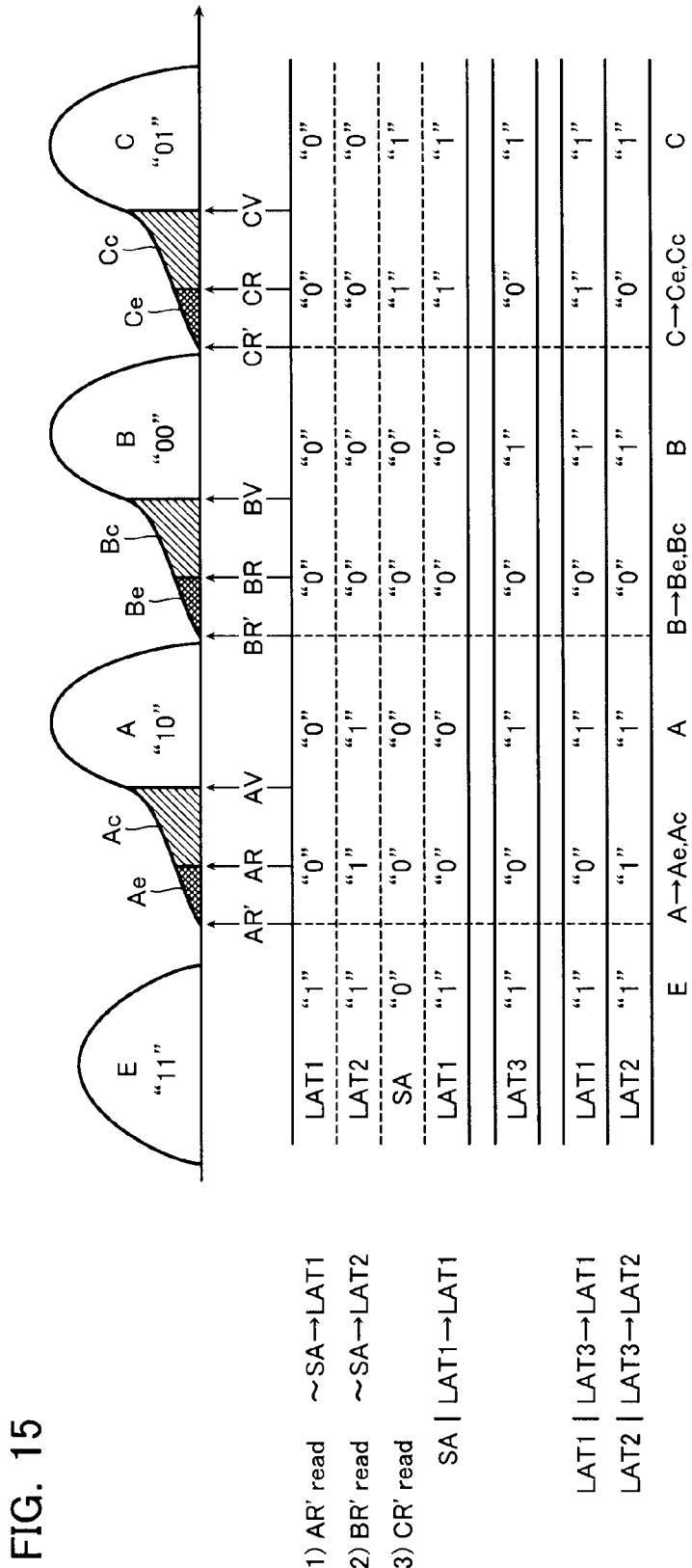
FIG. 15 illustrates another specific example of the data latch operation and the arithmetic operation performed in the additional write necessity determination operation (S15) in FIG. 10.
Figure 16:
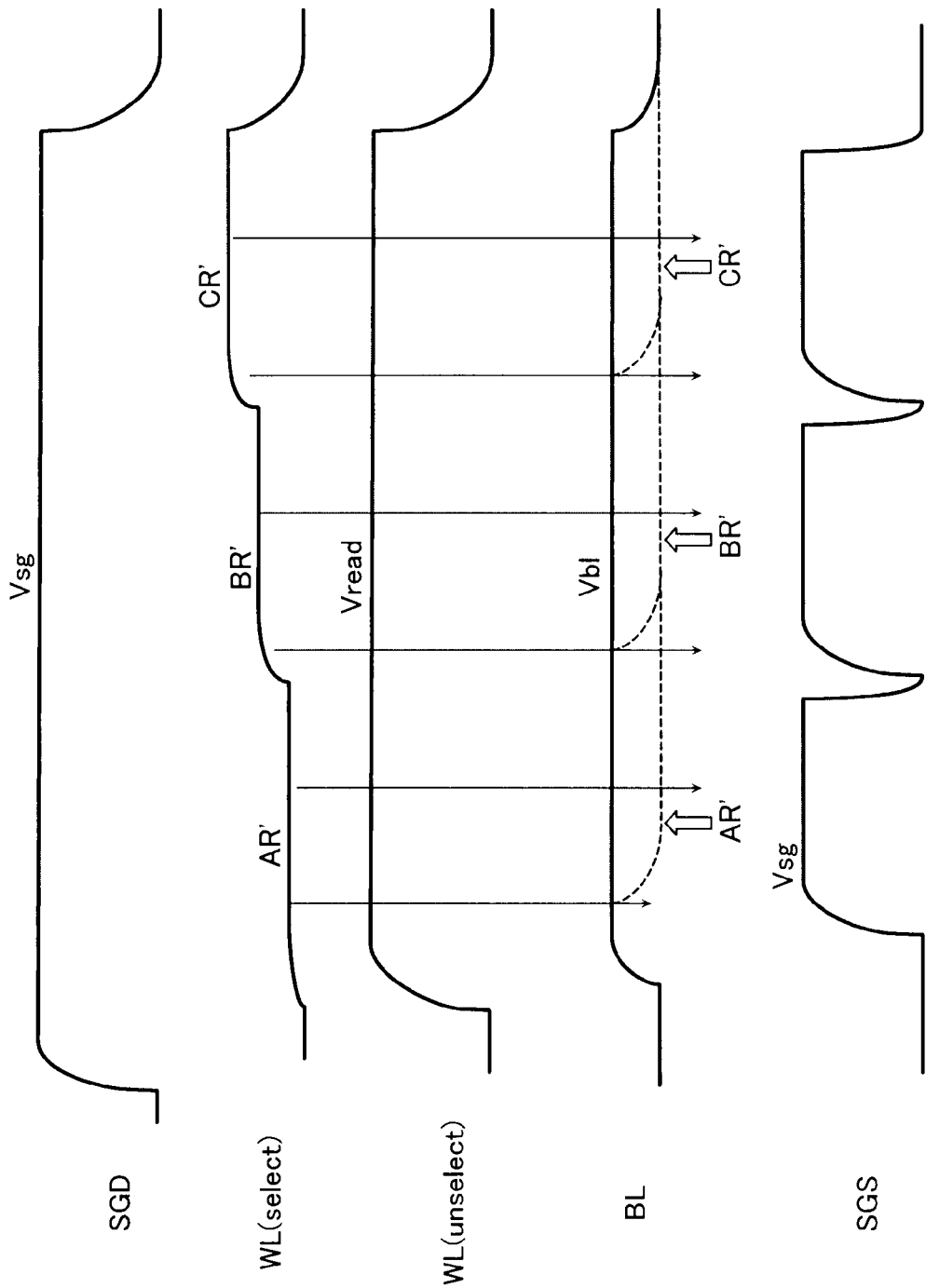
FIG. 16 is a timing diagram of changes of voltages applied to the word line WL, the bit line BL, and the select gate lines SGD and SGS shown in the operation in FIG. 15.

FIG. 15 and FIG. 16 show another example of the additional write necessity determination operation. First, the voltage application operation, the data latch operation, and the arithmetic operation shown in FIG. 13 and FIG. 14 are performed, and then the selected word line WL (select) is sequentially applied with the voltages AR', BR', and CR'. Inverted data of read data obtained from the sense amplifier circuit 3 applied with the voltage AR' is stored in the latch circuit LAT1. Further, inverted data of read data obtained from the sense amplifier circuit 3 applied with the voltage BR' is stored in the latch circuit LAT2. Further, logical OR of read data obtained from the sense amplifier circuit 3 applied with the voltage CR' and held data of the circuit LAT1 is arithmetically operated, and the operation result is newly stored in the latch circuit LAT1.

Further, logical OR of held data of the latch circuits LAT1 and LAT3 is arithmetically operated, and the operation result is newly stored in the latch circuit LAT1. Further, logical OR of held data of the latch circuits LAT2 and LAT3 is arithmetically operated, and the operation result is newly store in the latch circuit LAT2. Thus, the latch circuits LAT1 and LAT2 store different data depending on whether the additional write operation is necessary. Specifically, the data latch circuits LAT1 and LAT2, which correspond to the memory cells MTr being written with the threshold voltage distribution A, B, or C and having the subsequent variation within the tolerance, each store data "1," and are not subject to the additional write operation (in the additional write operation, the relevant memory cells MTr are in the write inhibit state (Inhibit)).

For memory cells MTr that originally have the normal threshold voltage distribution A (whose lower limit is equal to or more than the verify voltage AV), and change to the data variation distribution Ae or data degradation distribution Ac, the corresponding latch circuits LAT1 and LAT2 store data "0" and "1," respectively.

For memory cells MTr that originally have the normal threshold voltage distribution B, and change to the data variation distribution Be or the data degradation distribution Bc, the corresponding latch circuits LAT1 and LAT2 store data "0" and "0," respectively.

In the memory cells MTr that originally have the normal threshold voltage distribution C and change to the data variation distribution Ce or the data degradation distribution Cc, the corresponding latch circuits LAT1 and LAT2 store data "1" and "0," respectively. The memory cells MTr are subject to the additional write operation, and the additional write operation is performed depending on held data of the latch circuits LAT1 and LAT2.

As described above, in this embodiment, the data variation determination operation is performed in sequence from a word line connected to a memory cell having bad data-retention characteristics, and the additional write operation is performed to a word line that has a certain number of data variations or more. It is thus not necessary to perform the data copy operation adapting to the memory cell having bad data-retention characteristics, thereby making it possible to improve the device performance.

Second Embodiment

Figure 17:
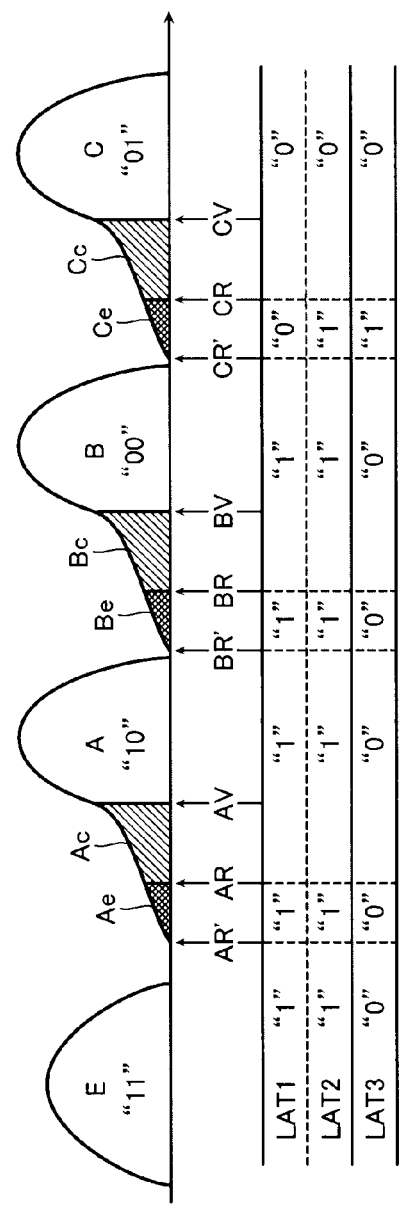
FIG. 17 illustrates a specific example of a data latch operation and an arithmetic operation performed in performed in a data variation determination operation (S12) of a non-volatile semiconductor memory device according to a second embodiment.
Figure 18:
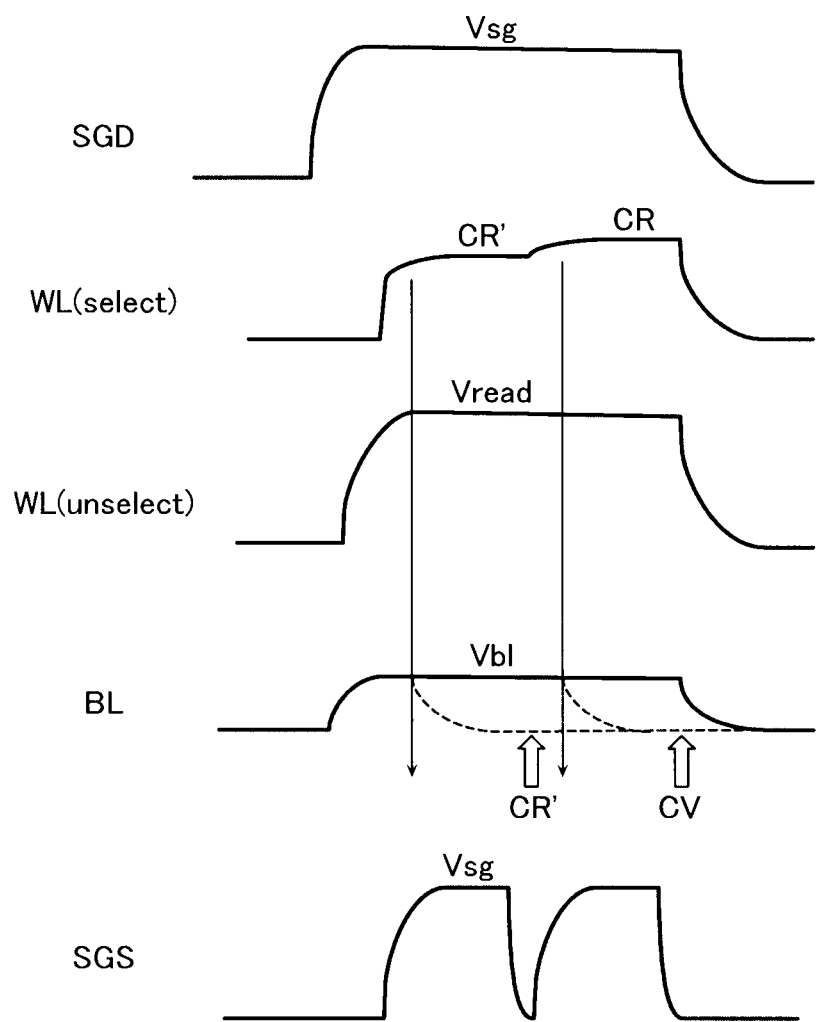
FIG. 18 is a timing diagram of changes of voltages applied to the word line WL, the bit line BL, and the select gate lines SGD and SGS in the data variation determination operation shown in FIG. 17.

Referring first to FIG. 17 and FIG. 18, a non-volatile semiconductor memory device according to a second embodiment will be described below. The entire configuration of the device may be similar to those in FIG. 1 to FIG. 7, and the redundant description of the configuration is omitted here. Further, the execution procedures of the data variation determination operation and the additional write necessity determination operation or the like are similar to those in the first embodiment and are as shown in FIG. 9 to FIG. 10. Note, however, that, in this embodiment, the voltage application operation, the data latch operation, and the arithmetic operation in the data variation determination operation (S12) are different from those in the first embodiment (in FIG. 11 and FIG. 12).

The data variation determination operation (S12) according to the second embodiment is adapted to determine the presence or absence of the data variations in the memory cell MTr having the threshold voltage distribution C. Specifically, the selected word line WL (select) is applied with only two levels of voltages, the voltages CR' and CR. Inverted data of read data of the sense amplifier circuit 3 when the voltage CR' is applied is stored in the latch circuit LAT1, while inverted data of read data of the sense amplifier circuit 3 when the voltage CR is applied is stored in the latch circuit LAT2. Then, the arismetic circuit OP arithmetically operates logical AND of inverted data of held data of the latch circuit LAT1 and held data of the latch circuit LAT2, and stores the operation result in the latch circuit LAT3.

By the above operation, only in the memory cell MTr that has the threshold voltage distribution C and changes to the data variation distribution Ce, the corresponding latch circuit LAT3 stores data "1." If the number N1 of data "1" is equal to or more than the reference value Ns1, the additional write operation similar to that in the first embodiment is performed. Note that the reference value Ns1 in step S14 is set to a number less than the reference value Ns1 in the first embodiment.

As the threshold voltage distribution C has a higher voltage level than the other threshold voltage distributions A and B, it is more likely for the distribution C to have data variations than the other threshold voltage distributions accordingly. Only the data variations of the threshold voltage distribution C may be determined for the improved recovery efficiency. According to the second embodiment, the data variation determination operation applies only two levels of voltages, and so, the data variation determination operation may require less time than that in the first embodiment, and the entire performance of the device may be improved compared to that in the first embodiment.

Third Embodiment

Figure 19:
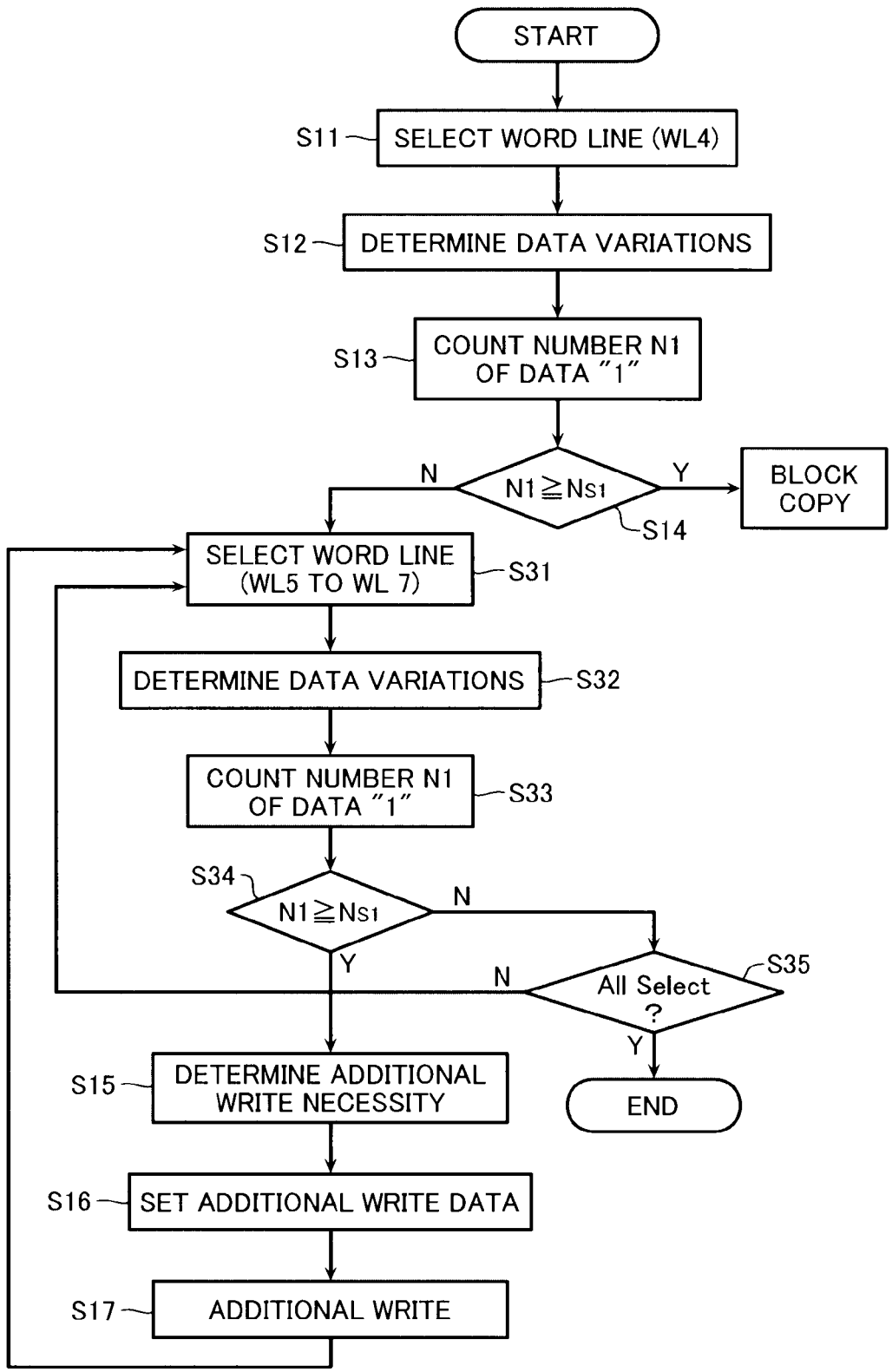
FIG. 19 is a flowchart of a specific execution procedure of a data variation determination operation and an additional write operation according to a third embodiment.

Referring first to FIG. 19, a non-volatile semiconductor memory device according to a third embodiment will be described below. The entire configuration of the device may be similar to those in FIG. 1 to FIG. 7, and the redundant description of the configuration is omitted here. Note, however, that the execution procedures of the data variation determination operation and the additional write necessity determination operation or the like are different from those in the above embodiments.

FIG. 19 is a flowchart of the execution procedures of a data variation determination operation and an additional write necessity determination operation or the like according to the third embodiment. The first embodiment describes an example where the data variation determination operation is first applied to the word line WL7. The word line WL7 is connected to the memory cell MTr7 in the bottom layer in the memory string MS. The memory cell MTr7 has the worst data-retention characteristics. In contrast, in this embodiment, the data variation determination operation is first applied to a word line WL (by way of example, the word line WL4 in FIG. 1 and FIG. 2) that is connected to a memory cell MTr having data-retention characteristics that are not the worst or best, for example, medium.

Then, as in the first embodiment, the word line WL4 is subjected to the data variation determination operation (S12), and the number N1 of data "1" is counted (S13). If the number N1 is equal to or more than the reference value Ns1 (Y in S14), and then, unlike the first embodiment, the entire memory block MB1 including the word line WL4 is subjected to the block copy operation (for copying whole data in the relevant memory block MB1 to a different block MB2).

If the number N1 is less than the reference value Ns1 (N in S14), the word lines WL5 to WL7 in layers lower than the word line WL4 are sequentially selected (S31), and similarly, the data variation determination operation (S32) and the count operation of the number N1 (S33) are performed. If the number N1 is less than the reference value Ns1 (N in S34), the same operation is repeated to the other pages until all word lines WL are selected (S35). If the number N1 is equal to or more than the reference value Ns1 (Y in S34), the additional write necessity determination operation and the additional write operation are performed to the word line WL as in the first embodiment (S15 to S17).

In the third embodiment, if the data variation determination operation at the word line WL4 determines that the number N1 is equal to or more than the reference value Ns1, the entire memory block MB1 including the word line WL4 is subjected to the block copy operation. This is for the following reason. If the data variation determination operation for the word line WL4 connected to a memory cell MTr having medium data-retention characteristics has a number of data variations equal to or more than the reference value Ns1, it may be estimated that the layers lower than the word line WL4 have a number of data variations equal to or more than that number.

It is also considered that the layers higher than the word line WL4 also have data variations more than the reference value Ns1. In this case, the data variation issue may be readily solved by performing the above block copy operation instead of performing the data variation determination operation and the additional write operation for each word line WL. The entire performance of the device may further be improved.

Note that the third embodiment shows an example where in step S11 in FIG. 19, the word line WL4 connected to a memory cell having medium data-retention characteristics is first subject to the data variation determination operation, and the process moves to the block copy operation if a certain number of data variations or more are found in the word line WL4. Instead, the control circuit AR2 may be designed to provide, for example, that the word line WL0 connected to the memory cell having the best data-retention characteristics is first subject to the first data variation determination operation, and the process moves to the block copy operation if a certain number of data variations or more are found in the word line WL0.

Fourth Embodiment

Figure 20:
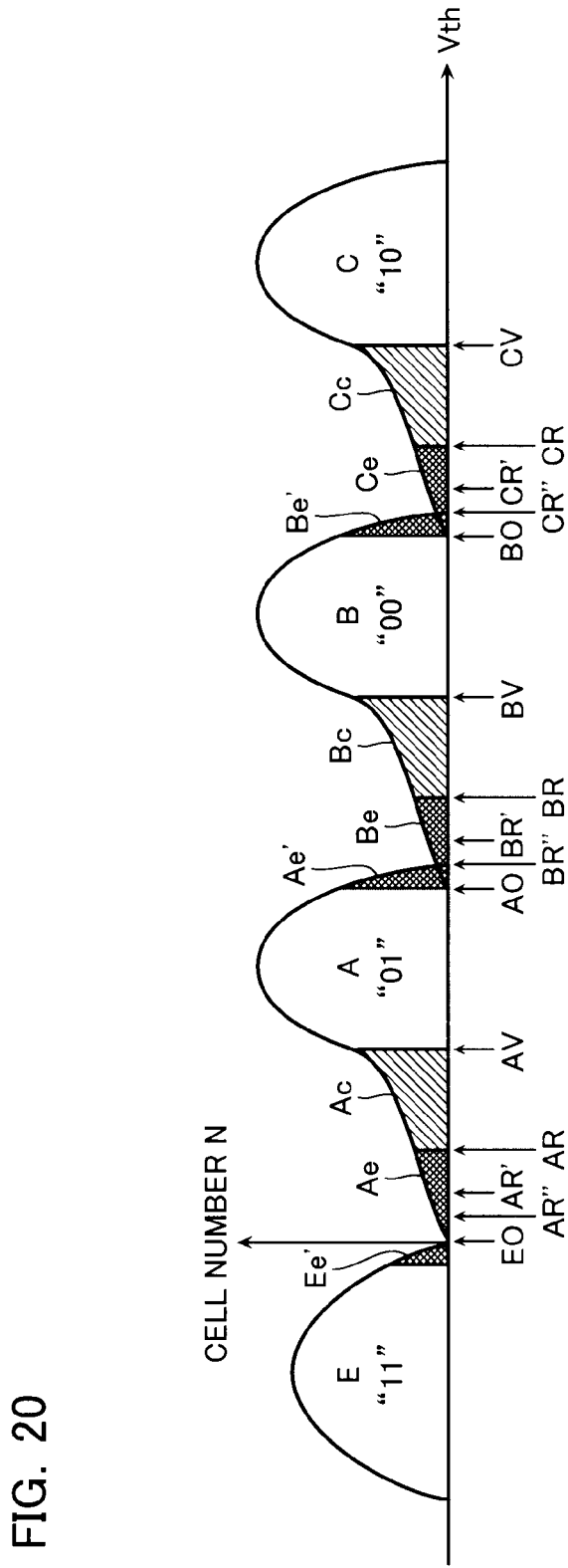
FIG. 20 is a schematic diagram generally illustrating a data variation determination operation according to a fourth embodiment.
Figure 21:
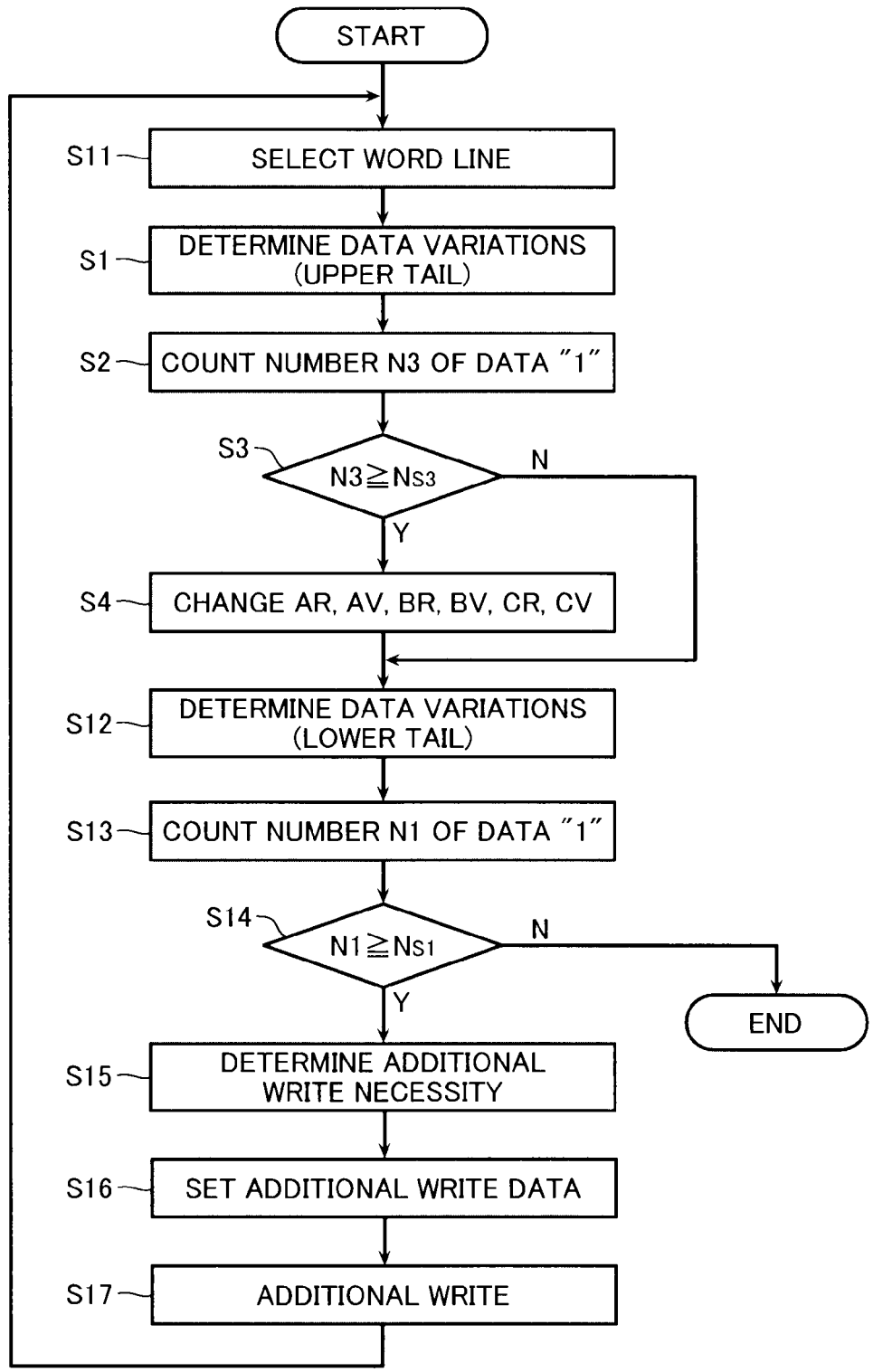
FIG. 21 is a flowchart of a specific execution procedure of a data variation determination operation and an additional write operation according to a fourth embodiment.
Figure 22:
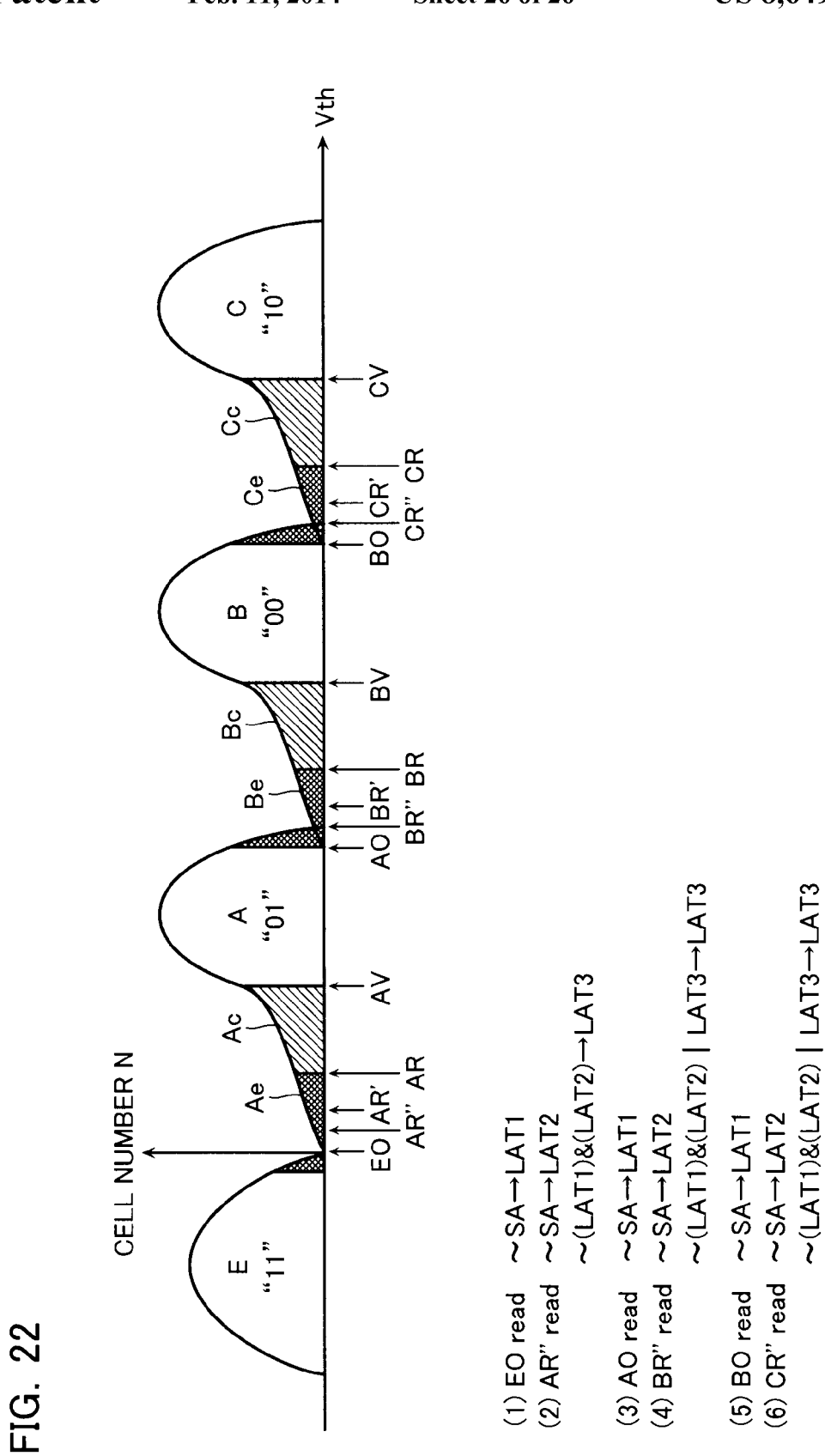
FIG. 22 illustrates a specific example of the data latch operation and an arithmetic operation performed in performed in data variation determination operation (S1).

Referring first to FIG. 20 to FIG. 22, a non-volatile semiconductor memory device according to a fourth embodiment will be described. The entire configuration of the device may be similar to those in FIG. 1 to FIG. 7, and the redundant description of the configuration is omitted here. Note, however, that the execution procedures of the data variation determination operation and the additional write necessity determination operation or the like are different from those in the above embodiments.

The above embodiments describe an example where the presence or absence of the lower-limit (lower-tail) data variations of the threshold voltage distributions A to C is determined, and the additional write operation is performed if a certain number of data variations or more are identified. In contrast, a non-volatile semiconductor memory device in the fourth embodiment is, unlike the above embodiments, adapted to be able to determine the presence or absence of the lower-tail data variations as well as the upper-tail data variations of the threshold voltage distributions E, A, and B. The data variation determination may be performed on the lower-tail data in a manner similar to that in the above embodiments.

With reference to FIG. 20, the data variation determination operation on the upper-tail data of the threshold voltage distributions E, A, and B will generally be described below. The data variation determination operation on the upper-tail data may be performed, for example, by supplying the selected word line WL with the voltages EO, AO, and BO still lower than the voltages AR', BR', and CR', and voltages (here, the voltages AR", BR", and CR") higher than the voltages EO, AO, and BO to perform the read operation. Preferably, the voltages EO, AO, and BO are voltages higher by a margin than the assumed upper limits of the threshold voltage distributions E, A, and B. Further, the voltages AR", BR", and CR" may be any voltages higher than the voltages EO, AO, and BO, and may be voltages equal to or higher than the voltages AR', BR', and CR'.

The above read operation may determine the presence or absence of a memory cell MTr having a threshold voltage higher than the voltage EO and lower than the voltage AR" (the presence or absence of the distribution Ee' in FIG. 20). Similarly, the read operation may also determine the presence or absence of a memory cell MTr having a threshold voltage higher than the voltage AO and lower than the voltage BR" (the presence or absence of the distribution Ae' in FIG. 20). The read operation may also determine the presence or absence of a memory cell MTr having a threshold voltage higher than the voltage CR" and lower than the voltage CR (the presence or absence of the distribution Be' in FIG. 20).

Note that in this embodiment, if the upper-tail data variations of the threshold voltage distributions E, A, and B are detected, the additional write operation is not performed, but the voltage levels of the read voltages AR, BR, and CR and the verify voltages AV, BV, and CV are raised to respond to the data variations. The block copy operation may also respond to the data variations.

FIG. 21 is a flowchart of specific execution procedures of the data variation determination operation and the additional write operation according to the fourth embodiment. Like steps as those in the first embodiment are designated with like symbols and their detailed description is omitted here. In the fourth embodiment, between step S11 and S12, the data variation determination operation is performed on the upper-tail data of the threshold voltage distributions E, A, and B (S1 to S4).

In a manner similar to that described in FIG. 20, the data variation determination operation is performed on the upper-tail data of the threshold voltage distributions E, A, and B (S1). As described below, if data variation has occurred, the latch circuit LAT3 corresponding to the memory cell MTr stores data "1." The number N3 of "1" is counted (S2), and it is determined whether the number N3 is equal to or more than the reference value Ns3 (S3).

If N3≥Ns3, then the voltage levels of the read voltages AR, BR, and CR and the verify voltages AV, BV, and CV are raised to respond to the data variations, as described above (S4). If N3<Ns3, then step S4 is skipped, and the process moves to the lower-tail data variations determination operation of the threshold voltage distributions A, B, and C (S12 to S17) as in the first embodiment. FIG. 22 shows the voltage application operation, the data latch operation, and the arithmetic operation when performing the data variation determination on the upper-tail data. As the detail is similar to that in the first embodiment, their detailed description is omitted here.

According to this embodiment, the upper-tail data variations of the threshold voltage distribution may also be detected, thereby further limiting the probability of the data variations.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

What is claimed is:

1. A non-volatile semiconductor memory device comprising:
   a semiconductor substrate;
   a memory string stacked above the semiconductor substrate and comprising a plurality of memory cells connected in series;
   a drain-side select transistor connected to a first end of the memory string;
   a source-side select transistor connected to a second end of the memory string;
   a plurality of word lines connected to the memory cell;
   a plurality of bit lines connected to the drain-side select transistor;
   a source line connected to the source-side select transistor; and
   a control circuit configured to control a voltage supplied to the drain-side select transistor, the source-side select transistor, the word lines, and the bit lines,
   the control circuit being capable of performing a data variation determination operation of determining whether a plurality of memory cells connected to a selected word line each have a threshold voltage equal to or less than a certain value, and whether the number of memory cells where data variation has occurred is not less than a certain number.

2. The non-volatile semiconductor memory device according to claim 1, wherein
   the data variation determination operation determines whether data variation has occurred by supplying a first voltage lower than a read voltage and a second voltage higher than the first voltage to a selected word line to read the memory cell.

3. The non-volatile semiconductor memory device according to claim 2, wherein
   the second voltage is a voltage substantially equal to a read voltage.

4. The non-volatile semiconductor memory device according to claim 2, wherein
the control circuit is configured to determine that data variation has occurred in a memory cell that turned off when the first voltage is applied thereto and turned on when the second voltage is applied thereto.

5. The non-volatile semiconductor memory device according to claim 4, wherein
the second voltage is a voltage substantially equal to a read voltage.

6. The non-volatile semiconductor memory device according to claim 4, further comprising:
a first latch circuit configured to hold first data read by supplying the first voltage to the word line;
a second latch circuit configured to hold second data read by supplying the second voltage to the word line;
an arithmetic circuit supplying an arithmetic operation to data including the first data and the second data; and
a third latch circuit configured to hold third data related to the arithmetic result of the arithmetic circuit.

7. The non-volatile semiconductor memory device according to claim 1, wherein
if the data variation determination operation determines that the memory cells along a selected word line have a certain number of data variations or more, the control circuit is adapted to be able to perform an additional write operation by using a first command in order to return the threshold voltage distributions of the memory cells along the selected word line to a normal state.

8. The non-volatile semiconductor memory device according to claim 7, wherein
the control circuit is adapted to be able to perform, before performing the additional write operation, an additional write necessity determination operation identifying a memory cell for which the additional write operation is necessary.

9. The non-volatile semiconductor memory device according to claim 8, wherein
the data variation determination operation determines whether variation occurs in the upper limit or lower limit of the threshold voltage distributions by supplying a first voltage lower than a read voltage and a second voltage higher than the first voltage to a selected word line to read the memory cell, and
the additional write necessity determination operation determines the necessity of the additional write operation by supplying the first voltage and a third voltage higher than the second voltage to a selected word line to read the memory cell.

10. The non-volatile semiconductor memory device according to claim 9, wherein
the third voltage is the substantially same voltage as a verify voltage to determine the completion of the write operation to the memory cell.

11. The non-volatile semiconductor memory device according to claim 1, wherein
the data variation determination operation is first performed to, among the memory cells included in the memory string, a first memory cell in the bottom layer.

12. The non-volatile semiconductor memory device according to claim 11, wherein
if the data variation determination operation determines that the memory cells along a selected word line have a certain number of data variations or more, the control circuit is adapted to be able to perform an additional write operation by using a first command in order to return the threshold voltage distributions of the memory cells along the selected word line to a normal state, and
the control circuit ends, if the number of first memory cells in which data variation is determined to occur is less than a certain value, the data variation determination operation and the additional write operation.

13. The non-volatile semiconductor memory device according to claim 1, wherein
the data variation determination operation is performed only to the memory cell having a first threshold voltage distribution that is the maximum threshold voltage distribution among a plurality of threshold voltage distributions.

14. The non-volatile semiconductor memory device according to claim 1, wherein
the data variation determination operation is first performed to, among the memory cells included in the memory string, a third memory cell between a first memory cell in the bottom layer and a second memory cell in the top layer.

15. The non-volatile semiconductor memory device according to claim 1, wherein
the control circuit is adapted to supply, in the data variation determination operation, various levels of first voltages and various levels of second voltages to the word line in ascending order of voltage level.

16. The non-volatile semiconductor memory device according to claim 1, wherein
the control circuit starts the data variation determination operation from the memory cell formed at a lower part of the columnar semiconductor layer, and performs the data variation determination operation to the memory cells formed at an upper part of the columnar semiconductor layer in sequence.

17. The non-volatile semiconductor memory device according to claim 1, wherein
the control circuit is adapted to perform the data variation determination operation to a first word line connected to a first memory cell formed at a first position of the columnar semiconductor layer, and when it is determined, as a result of the data variation determination operation to the first word line, that a predetermined number of data variations or more has occurred in the memory cells, to perform a block copy operation of copying data stored in the memory block including the relevant first word line to a different memory block.

18. A method of controlling a non-volatile semiconductor memory device,
the non-volatile semiconductor memory device comprising a semiconductor substrate, a memory string extending in the vertical direction with respect to the semiconductor substrate and comprising a plurality of memory cells connected in series, a drain-side select transistor connected to a first end of the memory string, a source-side select transistor connected to a second end of the memory string, a plurality of word lines connected to the memory cell, a plurality of bit lines connected to the drain-side select transistor, and a source line connected to the source-side select transistor,
the method comprising:
executing a data variation determination operation of determining whether variation has occurred in the upper limit or lower limit of a plurality of threshold voltage distributions in each of the memory cells by supplying a first voltage lower than a read voltage and a second voltage higher than the first voltage to a selected word line to read the memory cell; and executing, when the data variation determination operation determines that the memory cells along the selected word line have a certain number of data variations or more, an additional write operation of writing to return the threshold voltage distributions of the memory cells along the selected word line to a normal state.

19. The control method according to claim 18, wherein the data variation determination operation determines that data variation has occurred in a memory cell that becomes non-conductive when the first voltage is applied thereto and becomes conductive when the second voltage is applied thereto.

20. The control method according to claim 18, wherein before performing the additional write operation, an additional write necessity determination operation identifying a memory cell for which the additional write operation is necessary is performed.

* * * * *